(12) United States Patent
Wang et al.

(10) Patent No.: US 12,431,085 B2
(45) Date of Patent: Sep. 30, 2025

(54) PIXEL CIRCUIT AND DRIVING METHOD THEREFOR, ARRAY SUBSTRATE, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhu Wang, Beijing (CN); Yanyang Shang, Beijing (CN); Zhenglong Yan, Beijing (CN); Ling Shi, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

(*) Notice: Subject to any disclaimer, the term of this patent is extended or adjusted under 35 U.S.C. 154(b) by 0 days.

(21) Appl. No.: 18/558,257

(22) PCT Filed: Dec. 9, 2022

(86) PCT No.: PCT/CN2022/138079
§ 371 (c)(1),
(2) Date: Oct. 31, 2023

(87) PCT Pub. No.: WO2024/119503
PCT Pub. Date: Jun. 13, 2024

(65) Prior Publication Data
US 2025/0087151 A1    Mar. 13, 2025

(51) Int. Cl.
*G09G 3/32*     (2016.01)
*G09G 3/3233*   (2016.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
None
See application file for complete search history.

(56) References Cited

U.S. PATENT DOCUMENTS

2021/0090502 A1    3/2021   Choi et al.
2021/0118361 A1    4/2021   Li
(Continued)

FOREIGN PATENT DOCUMENTS

| CN | 114530464 A | 5/2022 |
|---|---|---|
| CN | 115394252 A | 11/2022 |

OTHER PUBLICATIONS

US 10,885,850 B2, 01/2021, Lin et al. (withdrawn)

*Primary Examiner* — Joseph R Haley
(74) *Attorney, Agent, or Firm* — Dority & Manning, P.A.

(57) ABSTRACT

A pixel circuit includes a driving transistor, a reset sub-circuit, a leakage prevention sub-circuit and a data writing sub-circuit. The reset sub-circuit is configured to, under control of a first scanning signal, transmit a reference voltage signal to a first electrode of the driving transistor. The leakage prevention sub-circuit is configured to, under control of a second scanning signal, connect the first electrode of the driving transistor to a control electrode of the driving transistor. The data writing sub-circuit is configured to, under control of a third scanning signal, transmit a data signal to a second electrode of the driving transistor. The reset sub-circuit and the data writing sub-circuit are turned on sequentially when the leakage prevention sub-circuit is turned on; and the reset sub-circuit is turned on at least once when the leakage prevention sub-circuit is turned off.

19 Claims, 24 Drawing Sheets

(51) Int. Cl.
*H10K 59/121* (2023.01)
*H10K 59/131* (2023.01)

(52) U.S. Cl.
CPC ... *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2340/0435* (2013.01)

(56) References Cited

U.S. PATENT DOCUMENTS

| | | | |
|---|---|---|---|
| 2022/0343852 A1 | 10/2022 | Wang et al. | |
| 2022/0366834 A1* | 11/2022 | Xia | G09G 3/3233 |
| 2023/0125275 A1* | 4/2023 | Mi | G09G 3/3266 |
| | | | 345/214 |

* cited by examiner

PIXEL CIRCUIT AND DRIVING METHOD THEREFOR, ARRAY SUBSTRATE, AND DISPLAY APPARATUS

CROSS-REFERENCE TO RELATED APPLICATION

This application is a national phase entry under 35 USC 371 of International Patent Application No. PCT/CN2022/138079 filed on Dec. 9, 2022, which is incorporated herein by reference in its entirety.

TECHNICAL FIELD

The present disclosure relates to the field of display technologies, and in particular, to a pixel circuit and a driving method therefor, an array substrate, and a display apparatus.

BACKGROUND

Organic light-emitting diode (OLED) display panels are widely used in display products such as cell phones, tablet computers, and digital cameras due to the advantages of active light emission, wide viewing angle, high contrast, fast response speed, low power consumption and so on, and therefore have attracted wide attention.

SUMMARY

In an aspect, a pixel circuit is provided. The pixel circuit includes a driving transistor, a reset sub-circuit, a leakage prevention sub-circuit and a data writing sub-circuit. The driving transistor includes a control electrode, a first electrode and a second electrode. The reset sub-circuit is electrically connected to a first scanning signal terminal, a reference voltage signal terminal and the first electrode of the driving transistor, and configured to, under control of a first scanning signal from the first scanning signal terminal, transmit a reference voltage signal from the reference voltage signal terminal to the first electrode of the driving transistor. The leakage prevention sub-circuit is electrically connected to a second scanning signal terminal, and the first electrode and the control electrode of the driving transistor, and configured to, under control of a second scanning signal from the second scanning signal terminal, connect the first electrode of the driving transistor to the control electrode of the driving transistor. The data writing sub-circuit is electrically connected to a third scanning signal terminal, a data signal terminal and the second electrode of the driving transistor, and configured to, under control of a third scanning signal from the third scanning signal terminal, transmit a data signal from the data signal terminal to the second electrode of the driving transistor. The reset sub-circuit and the data writing sub-circuit are configured to, under the control of respective scanning signals, be turned on sequentially in a case where the leakage prevention sub-circuit is turned on. The reset sub-circuit is configured to, under the control of the first scanning signal, be turned on at least once in a case where the leakage prevention sub-circuit is turned off.

In some embodiments, the reset sub-circuit includes a first transistor, the leakage prevention sub-circuit includes a second transistor, and the data writing sub-circuit includes a third transistor. A control electrode of the first transistor is electrically connected to the first scanning signal terminal, a first electrode of the first transistor is electrically connected to the reference voltage signal terminal, and a second electrode of the first transistor is electrically connected to the first electrode of the driving transistor. A control electrode of the second transistor is electrically connected to the second scanning signal terminal, a first electrode of the second transistor is electrically connected to the first electrode of the driving transistor, and a second electrode of the second transistor is electrically connected to the control electrode of the driving transistor. A control electrode of the third transistor is electrically connected to the third scanning signal terminal, the first electrode of the third transistor is electrically connected to the data signal terminal, and the second electrode of the third transistor is electrically connected to the second electrode of the driving transistor.

In some embodiments, the second transistor is a metal oxide thin film transistor; and the first transistor, the third transistor and the driving transistor are low temperature polysilicon thin film transistors.

In some embodiments, the reset sub-circuit is configured to, under the control of the first scanning signal, be turned on once or twice in the case where the leakage prevention sub-circuit is turned off.

In some embodiments, in the case where the leakage prevention sub-circuit is turned off, the data writing sub-circuit is configured to, under the control of the third scanning signal, be turned on at least once, and the data signal terminal is configured to output a first reset voltage signal.

In some embodiments, the pixel circuit further includes a first control sub-circuit, a second control sub-circuit, an unset sub-circuit and an energy storage sub-circuit. The first control sub-circuit is electrically connected to a light-emitting control signal terminal, a first voltage signal terminal and the first electrode of the driving transistor, and configured to, under control of a light-emitting control signal from the light-emitting control signal terminal, transmit a first voltage signal from the first voltage signal terminal to the first electrode of the driving transistor. The second control sub-circuit is electrically connected to the light-emitting control signal terminal and the second electrode of the driving transistor, the second control sub-circuit is configured to be electrically connected to a light-emitting device, and under the control of the light-emitting control signal, transmit a driving current from the driving transistor to the light-emitting device. The unset sub-circuit is electrically connected to the first scanning signal terminal and an initialization signal terminal, the unset sub-circuit is configured to be electrically connected to the light-emitting device, and under the control of the first scanning signal, transmit an initialization signal from the initialization signal terminal to the light-emitting device. The energy storage sub-circuit is electrically connected to the control electrode of the driving transistor and the first voltage signal terminal, and configured to maintain a voltage of the control electrode of the driving transistor.

In some embodiments, the first control sub-circuit includes a fourth transistor, the second control sub-circuit includes a fifth transistor, the reset sub-circuit includes a sixth transistor, and the energy storage sub-circuit includes a storage capacitor. A control electrode of the fourth transistor is electrically connected to the light-emitting control signal terminal, a first electrode of the fourth transistor is electrically connected to the first voltage signal terminal, and a second electrode of the fourth transistor is electrically connected to the first electrode of the driving transistor. A control electrode of the fifth transistor is electrically connected to the light-emitting control signal terminal, a first electrode of the fifth transistor is electrically connected to the second electrode of the driving transistor, and a second electrode of the fifth transistor is configured to be electrically connected to the light-emitting device. A control electrode of the sixth transistor is electrically connected to the first scanning signal terminal, a first electrode of the sixth transistor is electrically connected to the initialization signal terminal, and a second electrode of the sixth transistor is configured to be electrically connected to the light-emitting device. A first electrode plate of the storage capacitor is electrically connected to the control electrode of the driving transistor, and a second electrode plate of the storage capacitor is electrically connected to the first voltage signal terminal.

In another aspect, a driving method for a pixel circuit is provided. The driving method is used for driving the pixel circuit according to any of the above embodiments. A display frame includes an unset phase, a data writing phase and a first reset phase. The driving method includes: in the unset phase: outputting, by the first scanning signal terminal and the second scanning signal terminal, operating levels; outputting, by the third scanning signal terminal, a non-operating level; and transmitting the reference voltage signal from the reference voltage signal terminal to the control electrode of the driving transistor via the reset sub-circuit and the leakage prevention circuit; in the data writing phase: outputting, by the first scanning signal terminal, a non-operating level; outputting, by the second scanning signal terminal and the third scanning signal terminal, operating levels; outputting, by the data signal terminal, the data signal; transmitting the data signal to the second electrode of the driving transistor via the data writing sub-circuit; and writing the data signal and a threshold voltage to the control electrode of the driving transistor; and in the first reset phase: outputting, by the first scanning signal terminal, an operating level at least once; outputting, by the second scanning signal terminal, a non-operating level; and transmitting the reference voltage signal to the first electrode of the driving transistor via the reset sub-circuit.

In some embodiments, the pixel circuit has a first refresh rate and a second refresh rate, the first refresh rate is lower than the second refresh rate; the display frame further includes, at the first refresh rate, a light-emitting phase and a second reset phase that are after the first reset phase. The driving method further includes: in the light-emitting phase: outputting, by the first scanning signal terminal, the second scanning signal terminal and the third scanning signal terminal, non-operating levels; outputting, by a light-emitting control signal terminal, an operating level; and transmitting a driving current from the driving transistor to a light-emitting device; and in the second reset phase: outputting, by the first scanning signal terminal, an operating level; outputting, by the second scanning signal terminal, the third scanning signal terminal and the light-emitting control signal terminal, non-operating levels; and transmitting the reference voltage signal from the reference voltage signal terminal to the first electrode of the driving transistor via the reset sub-circuit.

In some embodiments, a voltage value of the reference voltage signal from the reference voltage signal terminal is a first reference voltage signal value in the first reset phase, and is a second reference voltage signal value in the second reset phase. The first reference voltage signal value is equal to the second reference voltage signal value, and the first reference voltage signal value and the second reference voltage signal value are negative values; or the first reference voltage signal value is less than the second reference voltage signal value, the first reference voltage signal value is a negative value, and the second reference voltage signal value is greater than a voltage value of the first voltage signal from the first voltage signal terminal.

In yet another aspect, an array substrate is provided. The array substrate includes: a substrate, and a plurality of pixel circuits disposed on the substrate and arranged in an array, the pixel circuits each being the pixel circuit according to any of the above embodiments.

In some embodiments, the pixel circuit includes a driving transistor, a first transistor, a third transistor and a storage capacitor. The array substrate further includes: a first semiconductor layer, a first gate conductive layer and a second gate conductive layer which are disposed on the substrate. The first semiconductor layer includes a first semiconductor pattern of the first transistor, a third semiconductor pattern of the third transistor, and a seventh semiconductor pattern of the driving transistor, where the third semiconductor pattern is connected to the seventh semiconductor pattern and has a gap from the first semiconductor pattern. The first gate conductive layer is located on a side of the first semiconductor layer away from the substrate, and includes first scanning signal lines, third scanning signal lines and a first electrode plate of the storage capacitor. The second gate conductive layer is located on a side of the first gate conductive layer away from the substrate, and includes a second electrode plate of the storage capacitor.

In some embodiments, the pixel circuit further includes a second transistor. The array substrate further includes: a second semiconductor layer, a third gate conductive layer, a first source-drain conductive layer and a second source-drain conductive layer. The second semiconductor layer is located on a side of the second gate conductive layer away from the substrate, and includes a second semiconductor pattern of the second transistor. The third gate conductive layer is located on a side of the second semiconductor layer away from the substrate, and includes second scanning signal lines and reference voltage signal lines. The first source-drain conductive layer is located on a side of the third gate conductive layer away from the substrate, and includes first connection patterns, second connection patterns and third connection patterns. A first connection pattern is connected to a reference voltage signal line and a first electrode of the first semiconductor pattern; a second connection pattern is connected to a second electrode of the first semiconductor pattern, a first electrode of the second semiconductor pattern, and a first electrode of the seventh semiconductor pattern; and a third connection pattern is connected to a second electrode of the second semiconductor pattern and the first electrode plate of the storage capacitor. The second source-drain conductive layer is located on a side of the first source-drain conductive layer away from the substrate, and includes data lines. A data line is connected to a first electrode of the third semiconductor pattern; and a second electrode of the third semiconductor pattern is connected to a second electrode of the seventh semiconductor pattern.

In some embodiments, on the substrate, an orthographic projection of the second semiconductor pattern partially overlaps with an orthographic projection of a third scanning signal line.

In some embodiments, the second semiconductor pattern includes a first portion and a second portion. On the substrate, an orthographic projection of the first portion is located on a side of an orthographic projection of the second scanning signal line proximate to an orthographic projection of the storage capacitor and overlaps with an orthographic projection of the third scanning signal line. The second portion is connected to the first portion and extends along a direction perpendicular to an extension direction of the third scanning signal line; on the substrate, an orthographic projection of the second portion intersects the orthographic projection of the second scanning signal line. Along the direction perpendicular to the extension direction of the third scanning signal line, a dimension of the first portion is greater than a dimension of the third scanning signal line, and on the substrate, two ends of the orthographic projection of the first portion are located on two sides of the orthographic projection of the third scanning signal line, respectively.

In some embodiments, on the substrate, the orthographic projection of the second portion overlaps with an orthographic projection of the second connection pattern.

In some embodiments, the second semiconductor pattern extends along a direction perpendicular to an extension direction of a third scanning signal line, and on the substrate, an orthographic projection of the second semiconductor pattern is separated from an orthographic projection of the second connection pattern.

In some embodiments, on the substrate, an orthographic projection of the third connection pattern partially overlaps with an orthographic projection of a third scanning signal line.

In some embodiments, on the substrate, an orthographic projection of the third connection pattern is located on a side of an orthographic projection of a third scanning signal line proximate to an orthographic projection of the storage capacitor; and the orthographic projection of the third connection pattern partially overlaps with an orthographic projection of the second semiconductor pattern, and an overlapping portion is located on a side of the orthographic projection of the third scanning signal line proximate to the orthographic projection of the storage capacitor.

In some embodiments, a portion of the third scanning signal line is bent toward a side away from the storage capacitor to form a concave portion, and the overlapping portion of orthographic projections of the third connection pattern and the second semiconductor pattern on the substrate is located in a region defining by the concave portion.

In some embodiments, the third semiconductor pattern is of an L-shaped structure. The third semiconductor pattern includes a first extension section and a second extension section. The first extension section extends along a first direction, and the first direction is a row direction in which the plurality of pixel circuits are arranged. The second extension section extends along a second direction and connected to the first extension section, and the second direction intersects the first direction. A third scanning signal line includes a main body and protruding portions. The main body extends along the first direction, and an orthographic projection of the main body on the substrate partially overlaps with an orthographic projection of the second extension section on the substrate. Protruding portions each extend along the second direction, and an orthographic projection of the protruding portion on the substrate partially overlaps with an orthographic projection of the first extension section on the substrate.

In some embodiments, the second gate conductive layer further includes an auxiliary second scanning signal line. The auxiliary second scanning signal line is configured to transmit the second scanning signal, and an orthographic projection of the auxiliary second scanning signal line on the substrate overlaps with an orthographic projection of a first scanning signal line on the substrate.

In still yet another aspect, a display apparatus is provided. The display apparatus includes the array substrate according to any of the above embodiments, and light-emitting devices disposed on the array substrate. The light-emitting devices are electrically connected to the pixel circuits of the array substrate, and configured to emit light under control of the pixel circuits.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
FIG. 1 is a structural diagram of a display panel, in accordance with some embodiments.

The technical solutions in embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of/the plurality of" means two or more unless otherwise specified.

Some embodiments may be described using the terms "coupled", "connected" and their derivatives. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The terms such as "parallel", "perpendicular" and "equal" as used herein include a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

In the transistors in the embodiments of the present disclosure, a control electrode of a transistor is a gate of the transistor, a first electrode of the transistor is one of a source and a drain of the transistor, and a second electrode of the transistor is the other of the source and drain of the transistor. Since the source and drain of the transistor may be symmetrical in structure, the source and drain thereof may be indistinguishable in structure. That is, the first electrode and second electrode of the transistor in the embodiments of the present disclosure may be indistinguishable in structure. Exemplarily, in the embodiments of the present disclosure, a first electrode (or a second electrode) of a driving transistor may be a source or drain in different phases of a display frame, that is, in different phases of a display frame, the source and drain of the driving transistor can be interchanged (the source and drain of the driving transistor are reversible). Of all other transistors (all transistors except the driver transistor), a first electrode is a source and a second electrode is a drain.

Embodiments of the present disclosure provide a display apparatus 1000, referring to FIG. 1, the display apparatus 1000 may be any apparatus that can display images whether in motion (e.g., a video) or stationary (e.g., a still image), and regardless of text or image. For example, the display apparatus 1000 may be any product or component having a display function, such as a television, a notebook computer, a tablet computer, a mobile phone, an electronic photo, an electronic billboard or indicator, a personal digital assistant (PDA), a navigator, a wearable device, an augmented reality (AR) apparatus, or a virtual reality (VR) apparatus.

The above-mentioned display apparatus 1000 may be an electroluminescent display apparatus or a photoluminescent display apparatus. In a case where the display apparatus 1000 is an electroluminescent display apparatus, the electroluminescent display apparatus may be an organic electroluminescent diode (organic light-emitting diode (OLED)) display apparatus or a quantum dot electroluminescent diode (quantum dot light-emitting diode (QLED)) display apparatus.

Figure 2:
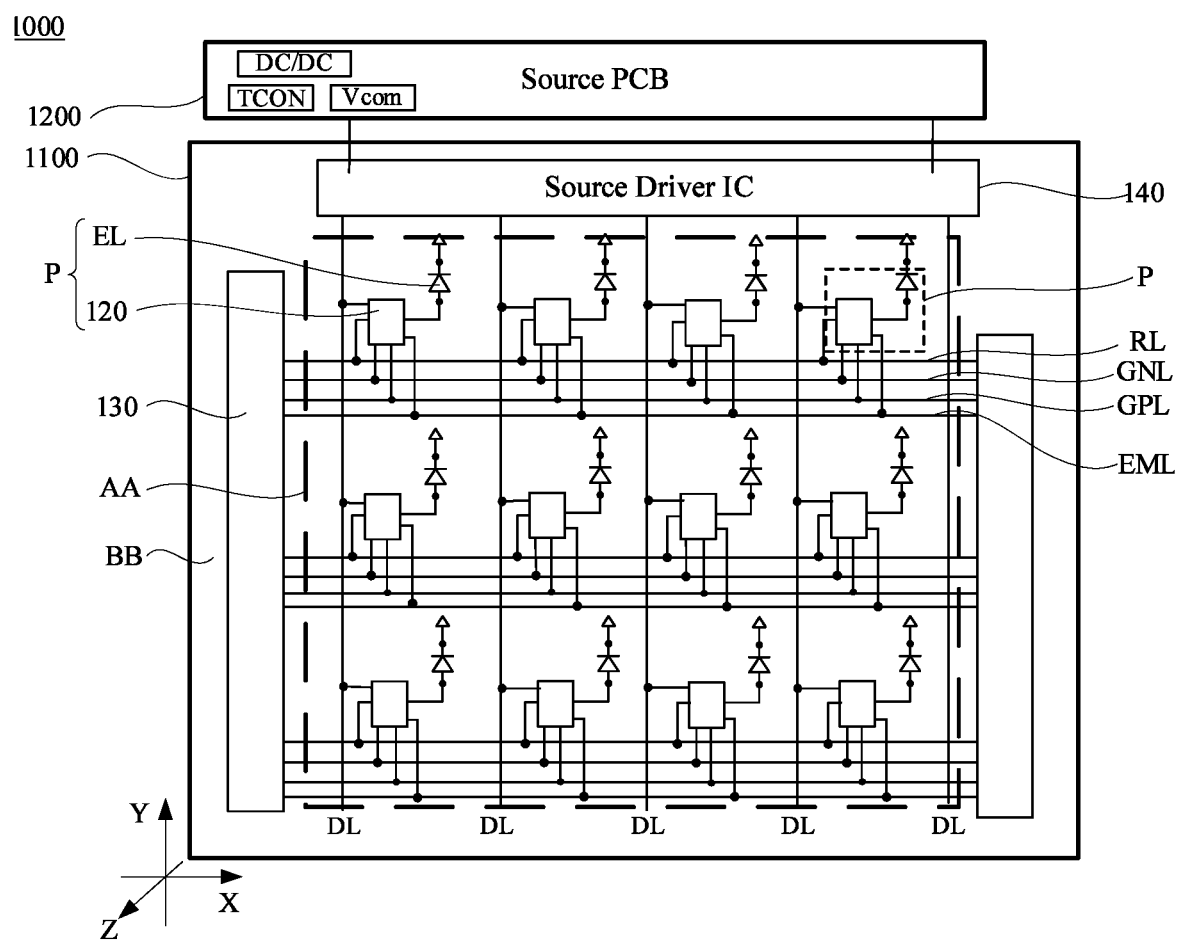
FIG. 2 is a structural diagram of another display panel, in accordance with some embodiments.

In some embodiments, referring to FIG. 2, the display apparatus 1000 includes a display panel 1100 and a driving circuit board (source printed circuit board (SPCB)) 1200.

As shown in FIG. 2, the display panel 1100 may include a display area AA and a peripheral area BB (may also be referred to as a non-display area). The peripheral area BB is located on at least one side of the display area AA. In the embodiments of the present disclosure, as shown in FIG. 2, the peripheral area BB surrounding the display area AA is described as an example.

The display area AA may include a plurality of sub-pixels P, a plurality of data lines DL and a plurality of scanning signal lines (first scanning signal lines RL, second scanning signal lines GNL, third scanning signal lines GPL and fourth scanning signal lines EML). The sub-pixel P includes a pixel circuit 120 and a light-emitting device EL. The plurality of sub-pixels P are arranged in multiple rows and multiple columns. Each row includes multiple sub-pixels P arranged along a first direction X, that is, the first direction X is a direction in which sub-pixels P in a row are arranged; and multiple rows of sub-pixels P are arranged along a second direction Y. Each column includes multiple sub-pixels P arranged along the second direction Y, that is, the second direction Y is a direction in which sub-pixels P in a column are arranged; and multiple columns of sub-pixels P are arranged along the first direction X. The first direction X and the second direction Y intersect. For example, the first direction X is perpendicular to the second direction Y.

Figure 3:
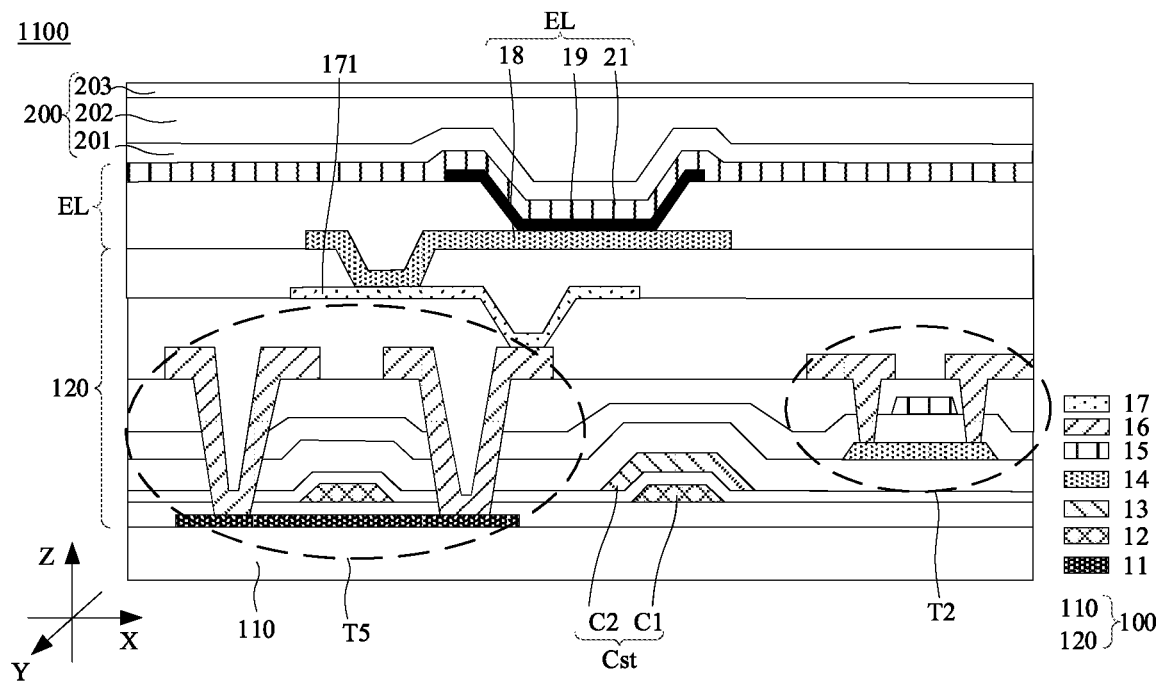
FIG. 3 is a sectional view showing a structure of a display panel, in accordance with some embodiments.

Referring to FIG. 3, the display panel 1100 may include an array substrate 100, light-emitting devices EL disposed on the array substrate 100, and an encapsulation layer 200 disposed on the light-emitting devices EL.

The array substrate 100 includes a substrate 110 and a plurality of pixel circuits 120 disposed on the substrate 110. The pixel circuit 120 may include a plurality of thin film transistors (TFTs) and a storage capacitor Cst, where only two thin film transistors (the fifth transistor T5 and the second transistor T5) are shown in FIG. 3.

As shown in FIG. 2, the plurality of pixel circuits may be arranged in a way similar to that of the plurality of sub-pixels P, that is, the plurality of pixel circuits are arranged in multiple rows and multiple columns. The row direction in which the plurality of pixel circuits are arranged is parallel to the row direction in which the plurality of sub-pixels P are arranged, that is, the first direction X can also be regarded as the row direction in which the plurality of pixel circuits are arranged.

As shown in FIG. 2, the peripheral area BB may include at least a gate driving circuit 130 and a source driver 140. The gate driving circuit 130 may include a plurality of shift registers (gate driver on array (GOA)), and each shift register is electrically connected to at least one row of pixel circuits 120 through one gate line (see below). The source driver 140 may be, for example, a source driver chip (source driver integrated circuit (IC)).

The driving circuit board 1200 includes driving circuits such as a timing controller (TCON), a power management chip DC/DC, and an adjustable resistance voltage division circuit Vcom (for generating a Vcom signal). The driving circuit board 1200 is electrically connected to the source driver 140 to control the source driver 140 to output data signals. The driving circuit board 1200 is further electrically connected to the gate driving circuit 130 to transmit control signals to the shift registers, so that respective shift registers GOA scan the multiple rows of sub-pixels P row by row. Thus, the display panel 1100 realizes the function of image display under the joint action of the electronic components and circuits such as the driving circuit board 1200, the source driver 140, the gate driving circuit 130, the pixel circuits 120, and the light-emitting devices EL.

The pixel circuit 120 includes a driving transistor DT, in which the channel of the driving transistor exhibits obvious hysteresis effect due to many defect states itself. The hysteresis effect of the driving transistor refers to an uncertainty in the electrical characteristics of the driving transistor under a certain bias voltage, that is, the magnitude of a current of the driving transistor is not only related to the current bias voltage, but also related to a bias state in the previous time phase. For example, an image at the previous moment (the previous frame phase) is often retained in an image display at the next moment, which leads to display problems such as flickering on the latter image.

In order to improve the hysteresis effect of the driving transistor, a reset transistor is usually added to the pixel circuit. The reset transistor can be used to reset a voltage of the source of the driving transistor (also called voltage unset or voltage initialization), and then adjust the bias state of the driving transistor to improve the hysteresis effect of the driving transistor. However, for the pixel circuit provided in this way, it will increase the number of transistors included in the pixel circuit, thereby increasing the space occupied by the pixel circuit, which is not conducive to improving the pixel density (pixels per inch (PPI)) of the display panel.

Figure 4:
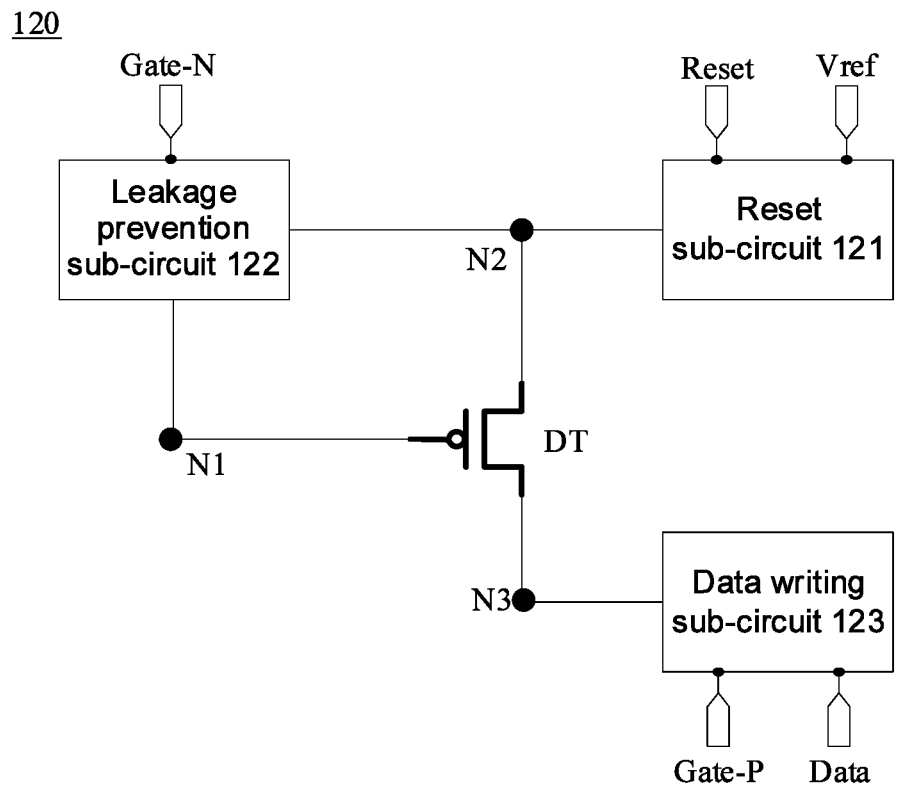
FIG. 4 is a block diagram showing a structure of a pixel circuit, in accordance with some embodiments.

In order to solve the above problems, some embodiments of the present disclosure provide a pixel circuit 120. Referring to FIG. 4, the pixel circuit 120 includes a driving transistor DT, a reset sub-circuit 121, a leakage prevention sub-circuit 122 and a data writing sub-circuit 123. The driving transistor DT includes a control electrode N1, a first electrode N2 and a second electrode N3.

The reset sub-circuit 121 is electrically connected to a first scanning signal terminal Reset, a reference voltage signal terminal Vref and the first electrode N2 of the driving transistor DT. The reset sub-circuit 121 is configured to, under control of a first scanning signal from the first scanning signal terminal Reset, transmit a reference voltage signal from the reference voltage signal terminal Vref to the first electrode N2 of the driving transistor DT.

The leakage prevention sub-circuit 122 is electrically connected to a second scanning signal terminal Gate-N, the first electrode N2 and the control electrode N2 of the driving transistor DT. The leakage prevention sub-circuit 122 is configured to, under control of a second scanning signal from the second scanning signal terminal Gate-N, connect the first electrode N2 of the driving transistor DT to the control electrode N1 of the driving transistor DT.

The data writing sub-circuit 123 is electrically connected to a third scanning signal terminal Gate-P, a data signal terminal Data and the second electrode N3 of the driving transistor DT. The data writing sub-circuit 123 is configured to, under control of a third scanning signal from the third scanning signal terminal Gate-P, transmit a data signal from the data signal terminal Data to second electrode N3 of the driving transistor DT.

The reset sub-circuit 121 and the data writing sub-circuit 123 are turned on sequentially when the leakage prevention sub-circuit 122 is turned on.

Turning on the leakage prevention sub-circuit 122 means that the leakage prevention sub-circuit 122 connects the first electrode N2 of the driving transistor DT to the control electrode N1 of the driving transistor DT under the control of the second scanning signal. Turning on the reset sub-circuit 121 means that the reset sub-circuit 121 transmits the reference voltage signal from the reference voltage signal terminal Vref to the first electrode N2 of the driving transistor DT under the control of the first scanning signal. Turning on the data writing sub-circuit 123 means that the data writing sub-circuit 123 transmits the data signal to the second electrode N3 of the driving transistor DT under the control of the third scanning signal from the third scanning signal terminal Gate-P.

Figure 9:
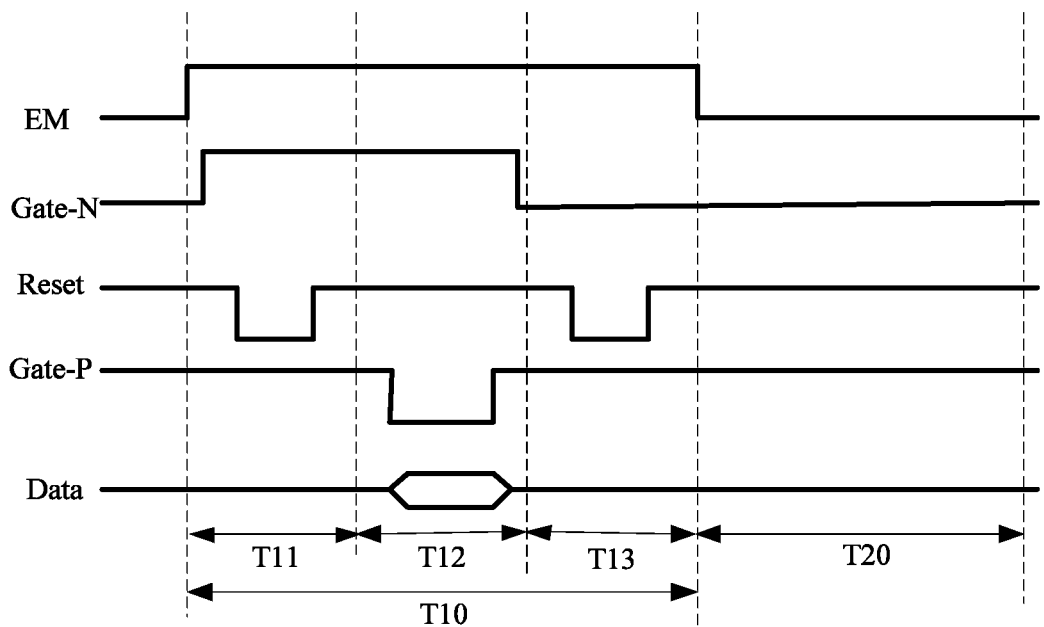
FIG. 9 is a timing diagram of a pixel circuit, in accordance with some embodiments.

As shown in FIG. 9, a display frame may include a refresh frame T10 and a hold frame T20 after the refresh frame T10, and the refresh frame T10 may include an unset phase T11, a data writing phase T12 and a first reset phase T13 arranged in sequence.

Exemplarily, the leakage prevention sub-circuit 122 is turned on in the unset phase T11 and the data writing phase T12, and the reset sub-circuit 121 is turned on in the unset phase T11, and the data writing sub-circuit 123 is turned on in the data writing phase T12.

Based on the above examples, in the unset phase T11, the leakage prevention sub-circuit 122 connects the first electrode N2 of the driving transistor DT with the control electrode N1 under the control of the second scanning signal. The reset sub-circuit 121 transmits the reference voltage signal to the first electrode N2 of the driving transistor DT under the control of the first scanning signal, and further, the reference voltage signal is transmitted from the first electrode N2 of the driving transistor DT to the control electrode N1 of the driving transistor DT. Based on this, when the leakage prevention sub-circuit 122 and the reset sub-circuit 121 are turned on simultaneously, the reference voltage signal from the reference voltage signal terminal Vref can be transmitted to the control electrode N1 of the driving transistor DT, so as to reset the voltage of the control electrode N1 of the driving transistor DT (also called voltage initialization or voltage unset).

In the data writing phase T12, the leakage prevention sub-circuit 122 connects the first electrode N2 of the driving transistor DT to the control electrode N1 of the driving transistor DT under the control of the second scanning signal. In the data writing phase T12, under the control of the third scanning signal, the data signal is transmitted to the second electrode N3 of the driving transistor DT, and is transmitted to the first electrode of the driving transistor DT after being compensated by the second electrode N3 of the driving transistor DT, and then transmitted to the control electrode N1 of the driving transistor DT via the leakage prevention sub-circuit 122, so as to implement threshold voltage compensation and writing of the data signal to the driving transistor DT.

When the leakage prevention sub-circuit 122 is turned off, the reset sub-circuit 121 is turned on at least once. Turning off the leakage prevention sub-circuit 122 means that the second scanning signal terminal does not output the second scanning signal (while outputs a non-operating level), and the reset sub-circuit 121 cannot connect the first electrode N2 of the driving transistor DT to the control electrode N1 of the driving transistor DT. That is to say, electrical signals cannot be transmitted between the first electrode N2 of the driving transistor DT and the control electrode N1 of the driving transistor DT through the leakage prevention sub-circuit 122.

Exemplarily, in the first reset phase T13, the leakage prevention sub-circuit 122 is turned off, and the reset sub-circuit 121 transmits the reference voltage signal to the first electrode N2 of the driving transistor DT under the control of the first scanning signal, and the reference voltage signal is not further transmitted to other nodes of the circuit. In this way, the reset sub-circuit 121 can reset the voltage of the first electrode N2 of the driving transistor DT, thereby adjusting the bias state of the driving transistor DT (thereby adjusting a voltage difference Vgs between the gate and the source of the driving transistor DT), to improve the hysteresis effect of the driving transistor.

In the embodiments of the present disclosure, the reset sub-circuit 121 can be used not only for resetting the voltage of the control electrode N1 of the driving transistor DT, but also for resetting the voltage of the first electrode N2 of the driving transistor DT. That is to say, the reset sub-circuit 121 can realize two functions (respectively reset the voltage of the control electrode N1 of the driving transistor DT and the voltage of the first electrode N2 of the driving transistor DT), so that there is no need to provide an unset transistor for resetting the voltage of the control electrode N1 of the driving transistor DT, thereby reducing the number of transistors included in the pixel circuit 120, which is beneficial to reducing the space occupied by the pixel circuit 120 and increasing the pixel density of the display panel 1100.

Moreover, in a pixel circuit provided in a case, both a reset sub-circuit and a data writing sub-circuit are usually electrically connected to a first electrode (source) of a driving transistor, so that a data signal and a reference voltage signal are written to the same node (the first electrode of driving transistor) in different phases (a data writing phase and a first reset phase). Compared with the pixel circuit, in the pixel circuit 120 provided by the embodiments of the present disclosure, the reset sub-circuit 121 is electrically connected to the first electrode N2 of the driving transistor DT, and the data writing sub-circuit 123 is electrically connected to the second electrode N3 of the driving transistor DT. Based on this, in the data writing phase T12, the data writing sub-circuit 123 transmits the data signal to the second electrode N3 of the driving transistor DT. During this phase, the second electrode N3 of the driving transistor DT serves as the source, and the data signal is transmitted from the second electrode N3 of the driving transistor DT to the first electrode N2 of the driving transistor DT. In the first reset phase T13, the reset sub-circuit 121 transmits the reference voltage signal to the first electrode N2 of the driving transistor DT, and during this phase, the first electrode N2 of the driving transistor DT serves as the source. That is to say, in the data writing phase T12 and the first reset phase T13, the source and drain of the driving transistor DT are reversed, and the bias states of the driving transistor DT are different, which is beneficial to improve the hysteresis effect of the driving transistor DT, reducing the risk of image flickering on the display panel 1100.

Figure 5:
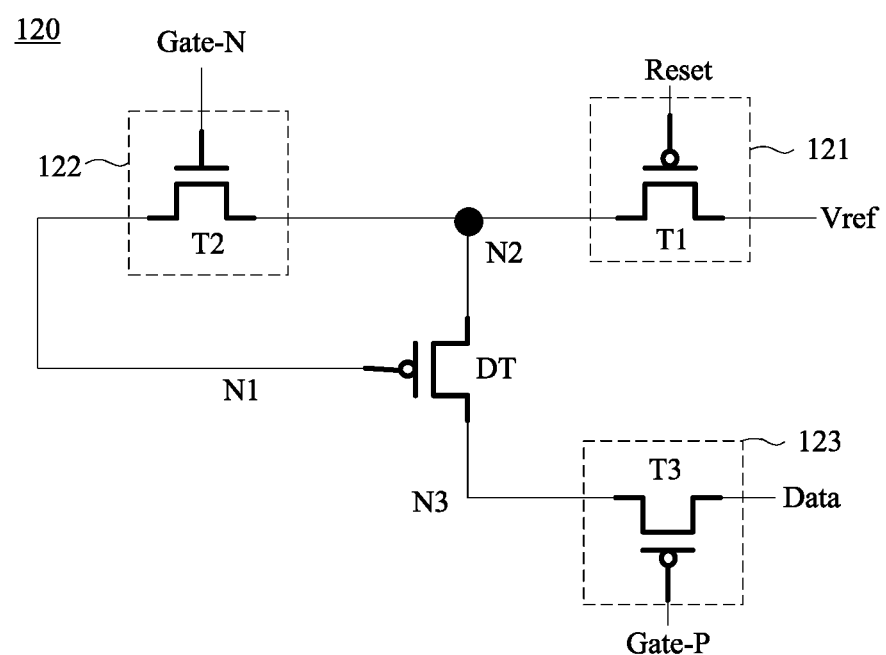
FIG. 5 is a structural diagram of a pixel circuit, in accordance with some embodiments.

In some embodiments, referring to FIG. 5, the reset sub-circuit 121 includes a first transistor T1, the leakage prevention sub-circuit 122 includes a second transistor T2, and the data writing sub-circuit 123 includes a third transistor T3.

Of the first transistor T1, a control electrode is electrically connected to the first scanning signal terminal Reset, a first electrode is electrically connected to the reference voltage signal terminal Vref, and a second electrode is electrically connected to the first electrode N2 of the driving transistor DT. Of the second transistor T2, a control electrode is electrically connected to the second scanning signal terminal Gate-N, a first electrode is electrically connected to the first electrode N2 of the driving transistor DT, and a second electrode is electrically connected to the control electrode N1 of the driving transistor DT. Of the third transistor T3, a control electrode is electrically connected to the third scanning signal terminal Gate-P, a first electrode is electrically connected to the data signal terminal Data, and a second electrode is electrically connected to the second electrode N3 of the driving transistor DT.

Exemplarily, both the first transistor T1 and the third transistor T3 are P-type transistors, and the P-type transistor is turned on when a voltage of its control electrode is low voltage, and turned off when the voltage of its control electrode is high voltage. Taking the reset sub-circuit 121 as an example, when the first scanning signal terminal Reset outputs the first scanning signal with a low voltage to the control electrode of the first transistor T1, the first transistor T1 is turned on under the control of the first scanning signal with the low voltage, that is, the reset sub-circuit 121 is turned on; conversely, the first transistor T1 is turned off under the control of a high voltage, that is, the reset sub-circuit 121 is turned off.

The second transistor T2 may be an N-type transistor, and the N-type transistor is turned on when a voltage of its control electrode is a high voltage, and is turned off when the voltage of its control electrode is a low voltage. In this way, when the second scanning signal terminal Gate-N outputs the second scanning signal with a high voltage to the control electrode of the second transistor T2, the second transistor T2 is turned on under the control of the second scanning signal with the high voltage, that is, the leakage prevention sub-circuit 122 is turned on; conversely, the second transistor T2 is turned off under the control of a low voltage, that is, the leakage prevention sub-circuit 122 is turned off.

In some embodiments, the second transistor T2 may be a metal oxide thin film transistor (TFT), and the metal oxide may be, for example, indium gallium zinc oxide (IGZO). The metal oxide thin film transistor has the advantage of low current, which is beneficial to reduce the leakage current of the second transistor T2, thereby improving the voltage holding capacity of the control electrode N1 of the driving transistor DT.

The first transistor T1, the third transistor T3 and the driving transistor DT are low temperature polysilicon (LTPS) thin film transistors. The low-temperature polysilicon thin film transistors have high electron mobility, which is beneficial to reduce the load of each transistor and reduce the energy consumption of the pixel circuit 120.

In some embodiments, the reset sub-circuit 121 may be turned on once or twice when the leakage prevention sub-circuit 122 is turned off. That is to say, in the first reset phase T13, the first scanning signal terminal Reset outputs the first scanning signal (operating level) once or twice, and the reset sub-circuit 121 transmits the reference voltage to the first electrode N2 of the driving transistor DT once or twice under the control of the first scanning signal.

Figure 10:
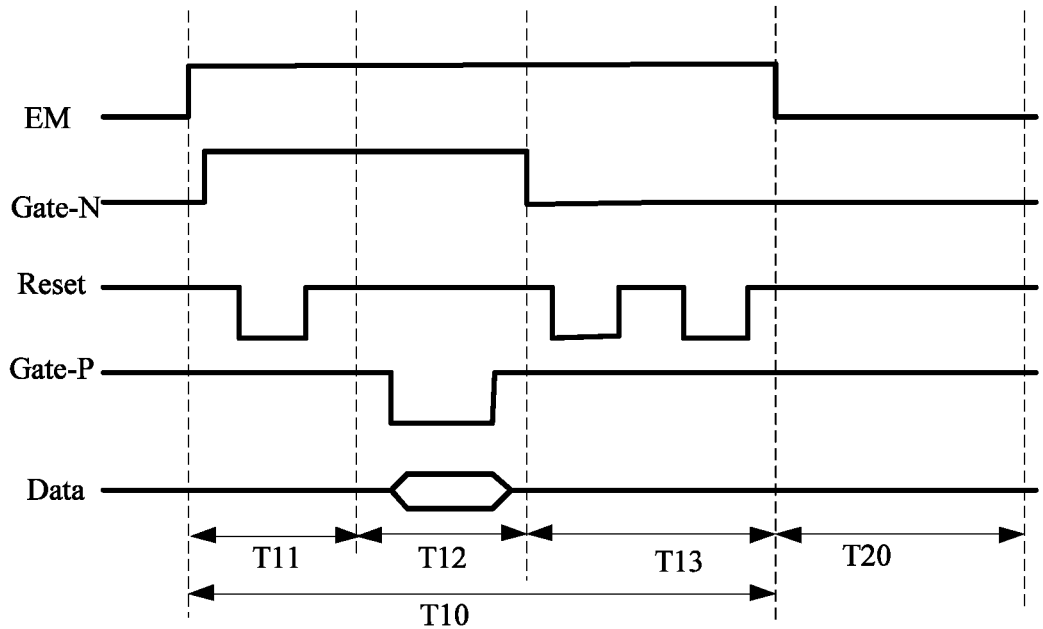
FIG. 10 is another timing diagram of a pixel circuit, in accordance with some embodiments.

Exemplarily, as shown in FIG. 9, in the first reset phase T13, the first scanning signal terminal Reset outputs the operating level once, and the reset sub-circuit 121 is turned on once. In this way, on the premise of realizing the reset of the voltage of the first electrode N2 of the driving transistor DT, it is beneficial to reduce the duration of the first reset phase T13, and it is beneficial for the display panel 1100 to achieve a high refresh rate (such as 120 Hz). Alternatively, exemplarily, as shown in FIG. 10, in the first reset phase T13, the first scanning signal terminal Reset outputs the operating level twice, and the reset sub-circuit 121 is turned on twice. In this way, it is beneficial for the reference voltage signal to be more fully transmitted to the first electrode N2 of the driving transistor DT, and the voltage reset of the first electrode N2 of the driving transistor DT is more sufficient.

It can be understood that, in the first reset phase T13, the first scanning signal terminal Reset can also output the first scanning signal more than twice, for example, the first scanning signal terminal Reset can output the first scanning signal three times, four times or five times, the embodiments of the present disclosure will not list them one by one.

Figure 11:
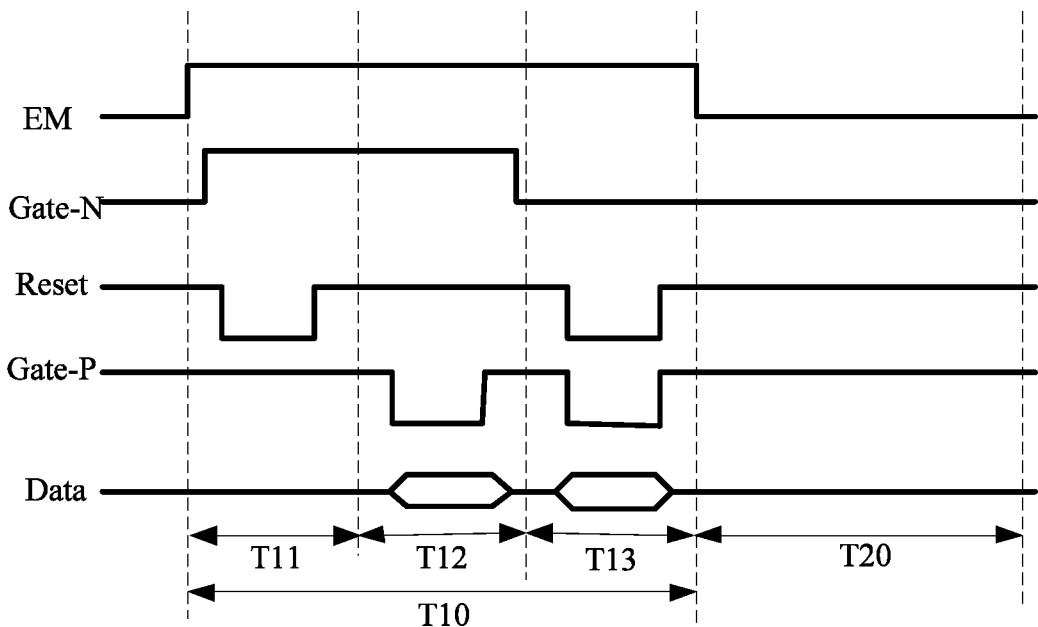
FIG. 11 is yet another timing diagram of a pixel circuit, in accordance with some embodiments.
Figure 12:
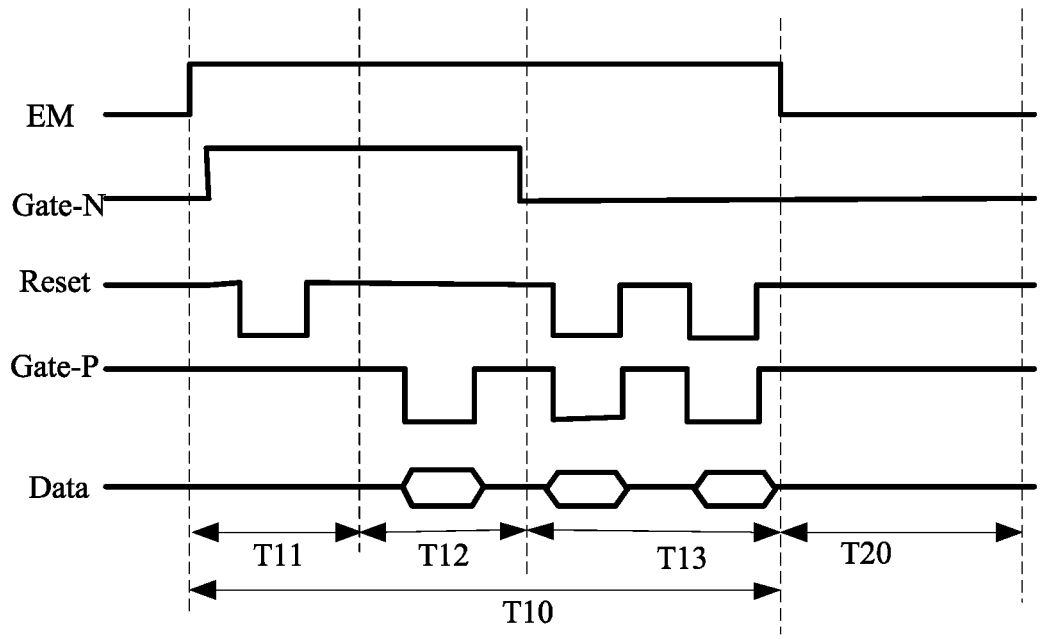
FIG. 12 is still yet another timing diagram of a pixel circuit, in accordance with some embodiments.

In some embodiments, as shown in FIG. 11 and FIG. 12, when the leakage prevention sub-circuit 122 is turned off, the data writing sub-circuit 123 is turned on at least once, and the data signal terminal Data outputs a first reset voltage signal. In the data writing phase T12, the data writing sub-circuit 123 will transmit the data signal to the second electrode N3 of the driving transistor DT, and a bias occurs between the second electrode N3 of the driving transistor DT and the first electrode N2 of the driving transistor DT, and after the data writing phase T12 ends, there may be a residual voltage on the second electrode N3 of the driving transistor DT. In light of this, when the leakage prevention sub-circuit 122 is turned off, the data writing sub-circuit 123 is turned on at least once, and after the data writing phase T12, the data writing sub-circuit 123 can transmit the first reset voltage signal to the second electrode N3 of the driving transistor DT to reset the voltage of the second electrode N3 of the driving transistor DT. In this way, the influence of the data signal on the voltage of the second electrode N3 of the driving transistor DT is reduced, thereby reducing the risk of display brightness difference of the display panel 1100 caused by the change of the data signal, and reducing the risk of flickering on the display panel 1100.

It can be understood that, in multiple rows of pixel circuits 120 included in the display panel 1100, data writing sub-circuits 123 are turned on row by row (write data signals row by row) in the refresh frame T10, and then enter the first reset phase row by row. In this way, when a target row of pixel circuits (any row of pixel circuits) is in the first reset phase T13 and data writing sub-circuits 123 are turned on, data writing sub-circuits in a certain row of pixel circuits after the target row of pixel circuits (hereinafter referred to as a subsequent row of pixel circuits) are turned on to write a data signal. In light of this, the data signal of the subsequent row of pixel circuits is written to second electrodes N3 of driving transistors DT of the target row of pixel circuits via the data writing sub-circuits of the target row of pixel circuits, so as to reset voltages of the second electrodes N3 of the driving transistors DT of the target row of pixel circuits N3. That is to say, in the first reset phase, the first reset voltage signal (of the target row of pixel circuits) is the data signal of the subsequent row of pixel circuits. The data signal is usually a positive voltage, which can increase the voltages of the second electrodes N3 of the driving transistors DT in the target row of pixel circuits, and play the role of pre-charging the second electrode N3 of the driving transistor DT before the light-emitting phase, which is beneficial to reduce the flickering phenomenon on the display panel 1100 when switching between a low refresh rate and a high refresh rate or when switching between display images.

Exemplarily, in the first reset phase T13, when the leakage prevention sub-circuit 122 is turned off, the data writing sub-circuit 123 is turned on under the control of the third scanning signal, and then transmits the first reset voltage signal from the data signal terminal Data to the second electrode N3 of the driving transistor DT. Exemplarily, the third scanning signal terminal Gate-P outputs an operating level (low-voltage level signal) referring to FIG. 11, the third transistor T3 is turned on, and the first reset voltage signal of the data signal terminal Data is transmitted to the second electrode N3 of the driving transistor DT through the third transistor T3.

Exemplarily, when the leakage prevention sub-circuit 122 is turned off, the reset sub-circuit 121 and the data writing sub-circuit 123 are turned on for the same number of times. For example, in the first reset phase T13, both the reset sub-circuit 121 and the data writing sub-circuit 123 are turned on once, and referring to FIG. 11, both the first scanning signal terminal Reset and the third scanning signal terminal Gate-P output an operating level. Alternatively, in the first reset phase T13, both the reset sub-circuit 121 and the data writing sub-circuit 123 are turned on twice, and referring to FIG. 12, both the first scanning signal terminal Reset and the third scanning signal terminal Gate-P output operating levels in sequence.

Exemplarily, both the first scanning signal and the third scanning signal are pulse signals, and have the same pulse width. For example, the reset sub-circuit 121 and the data writing sub-circuit 123 can be turned on and off simultaneously, that is, as shown in FIG. 11 and FIG. 12, the first scanning signal terminal Reset and the third scanning signal terminal Gate-P output the first scanning signal and the third scanning signal respectively in the same phase of time.

Figure 6:
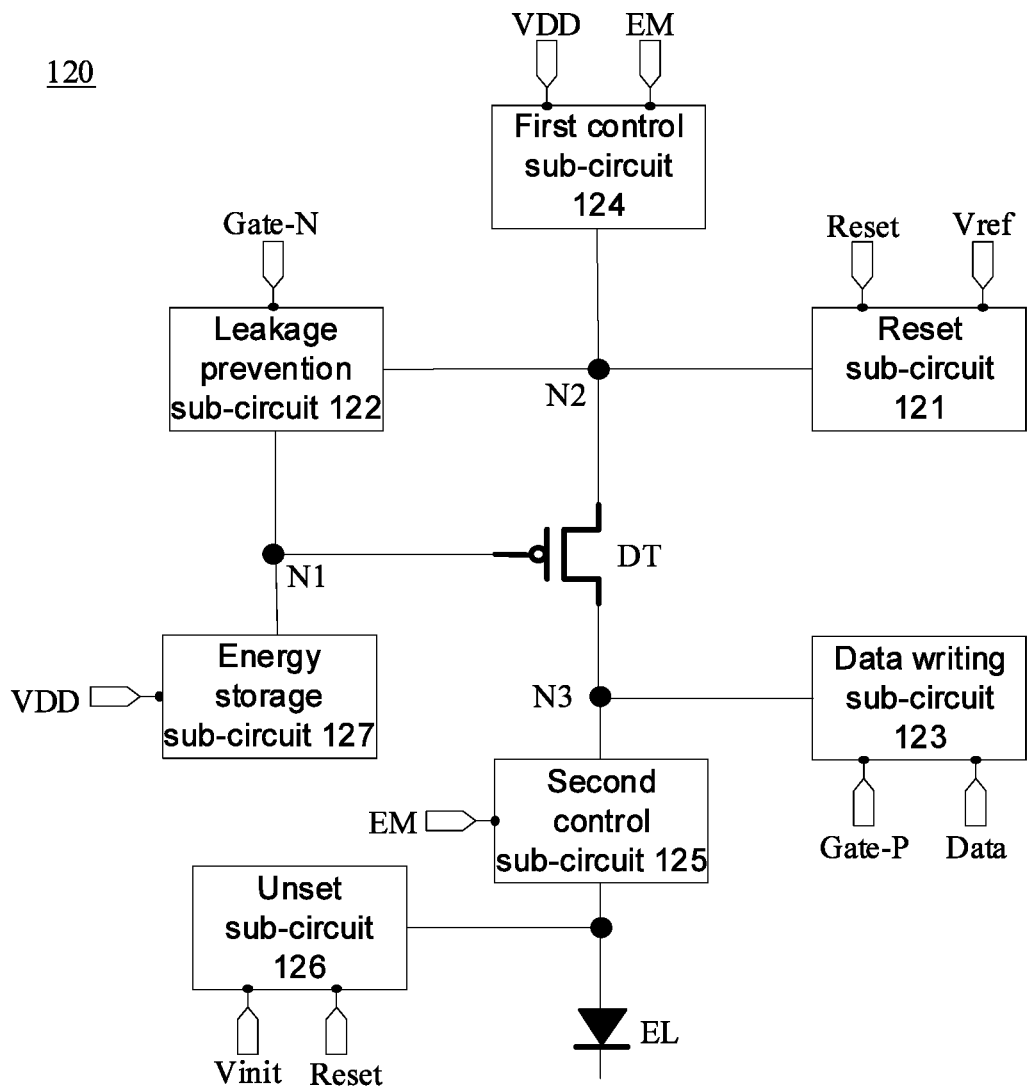
FIG. 6 is a block diagram showing a structure of another pixel circuit, in accordance with some embodiments.

In some embodiments, referring to FIG. 6, the pixel circuit 120 includes a first control sub-circuit 124, a second control sub-circuit 125, an unset sub-circuit 126 and an energy storage sub-circuit 127.

The first control sub-circuit 124 is electrically connected to a light-emitting control signal terminal EM (also referred to as an enable signal terminal), a first voltage signal terminal VDD and the first electrode N2 of the driving transistor DT. The first control sub-circuit 124 is configured to, under control of a light-emitting control signal from the light-emitting control signal terminal EM, transmit a first voltage signal from the first voltage signal terminal VDD to the first electrode N2 of the driving transistor DT.

The second control sub-circuit 125 is electrically connected to the light-emitting control signal terminal EM, the second electrode N3 of the driving transistor DT and a light-emitting device EL. The second control sub-circuit 125 is configured to, under the control of the light-emitting control signal, transmit a driving current from the driving transistor DT to the light-emitting device EL.

The unset sub-circuit 126 is electrically connected to the first scanning signal terminal Reset, an initialization signal terminal Vinit and the light-emitting device EL (specifically an anode of the light-emitting device EL). The unset sub-circuit 126 is configured to, under the control of the first scanning signal (from the first scanning signal terminal Reset), transmit an initialization signal from the initialization signal terminal Vinit to the light-emitting device EL.

The energy storage sub-circuit 127 is electrically connected to the control electrode N1 of the driving transistor DT and the first voltage signal terminal VDD. The energy storage sub-circuit 127 is configured to maintain a voltage of the control electrode N1 of the driving transistor DT.

Figure 13A:
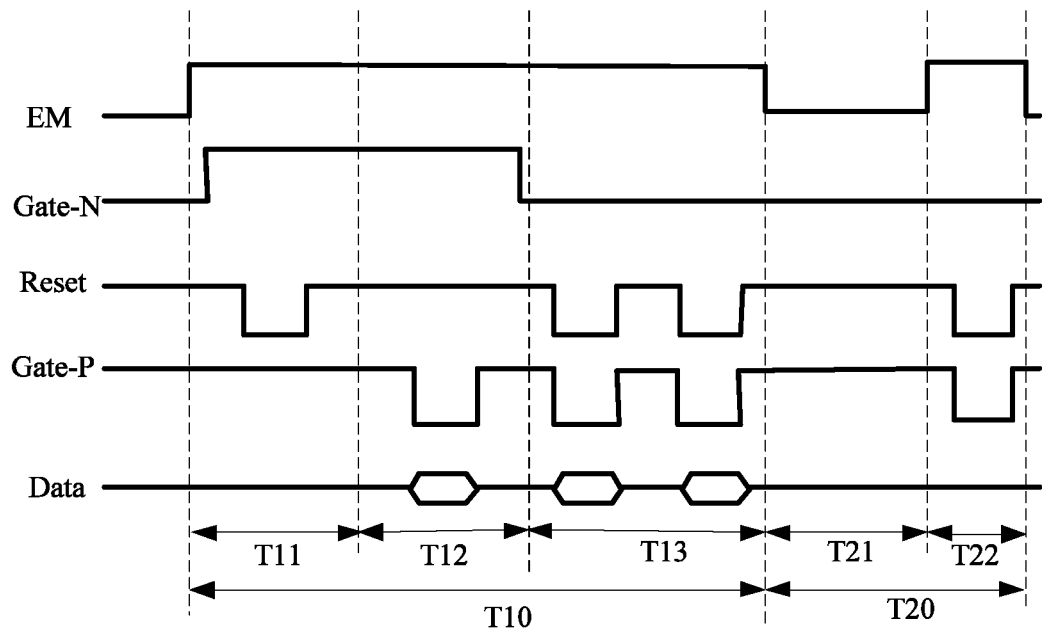
FIG. 13A is still yet another timing diagram of a pixel circuit, in accordance with some embodiments.

Exemplarily, as shown in FIG. 13A, the hold frame T20 includes a light-emitting phase T21. In the light-emitting phase T21, the first control sub-circuit 124 is turned on under the control of the light-emitting control signal, and the first voltage signal from the first voltage signal terminal VDD is transmitted to the first electrode N2 of the driving transistor DT via the first control sub-circuit 124. A driving current is generated in the driving transistor DT under the control of the voltage difference between the control electrode N1 and the first electrode N2. The second control sub-circuit 125 is also turned on under the control of the light-emitting control signal, and the driving current generated by the driving transistor DT is transmitted to the light-emitting device EL via the second control sub-circuit 125, and the light-emitting device EL starts to emit light under the action of the driving current (to be lit).

Both the unset sub-circuit 126 and the reset sub-circuit 121 are electrically connected to the first scanning signal terminal Reset, and both are turned on under the control of the scanning signal from the first scanning signal terminal Reset. In this way, when the reset sub-circuit 121 in any of the above-mentioned embodiments is turned on, the unset sub-circuit 126 is turned on synchronously with the reset sub-circuit 121, and resets a voltage on the light-emitting device EL (the anode of the light-emitting device EL) once.

For example, after the compensated data signal is transmitted to the control electrode N1 of the driving transistor DT, the energy storage sub-circuit 127 can maintain the voltage of the control electrode N1 of the driving transistor DT in the data writing phase T12, and reduce the leakage current of the control electrode N1 of the driving transistor DT, so that a stable driving current can be generated in the driving transistor DT in the light-emitting phase T21, to drive the light-emitting device EL to emit light and make the light-emitting device EL display a preset gray scale.

Figure 7A:
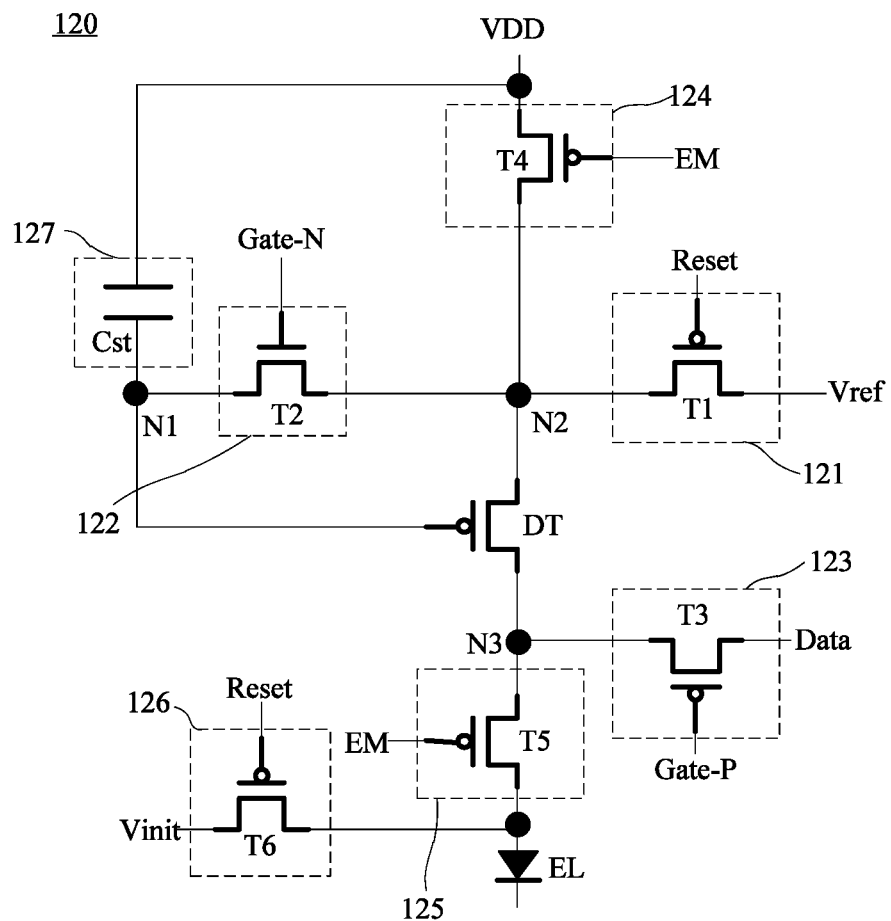
FIG. 7A is a structural diagram of another pixel circuit, in accordance with some embodiments.

In some embodiments, referring to FIG. 7A, the first control sub-circuit 124 includes a fourth transistor T4, the second control sub-circuit 125 includes a fifth transistor T5, the unset sub-circuit 126 includes a sixth transistor T6, and the energy storage sub-circuit 127 includes a storage capacitor Cst.

As shown in FIG. 7A, of the fourth transistor T4, a control electrode is electrically connected to the light-emitting control signal terminal EM, a first electrode is electrically connected to the first voltage signal terminal VDD, and a second electrode is electrically connected to the first electrode N2 of the driving transistor DT; of the fifth transistor T5, a control electrode is electrically connected to the light-emitting control signal terminal EM, a first electrode is electrically connected to the second electrode N3 of the driving transistor DT, and a second electrode is electrically connected to the light-emitting device EL; of the sixth transistor T6, a control electrode is electrically connected to the first scanning signal terminal Reset, a first electrode is electrically connected to the initialization signal terminal Vinit, and a second electrode is electrically connected to the light-emitting device EL; and of the storage capacitor Cst, a first electrode plate is electrically connected to the control electrode of the driving transistor DT, and a second electrode plate is electrically connected to the first voltage signal terminal VDD.

In some embodiments, the fourth transistor T4, the fifth transistor T5 and the sixth transistor T6 are low temperature polysilicon thin film transistors. The storage capacitor Cst may be a capacitive device manufactured separately through a process. Exemplarily, the capacitive device may be realized by making special capacitive electrode plates (the first and second electrode plates of the storage capacitor Cst), for example, each capacitive electrode plate of the storage capacitor can be realized by a metal layer.

Figure 7B:
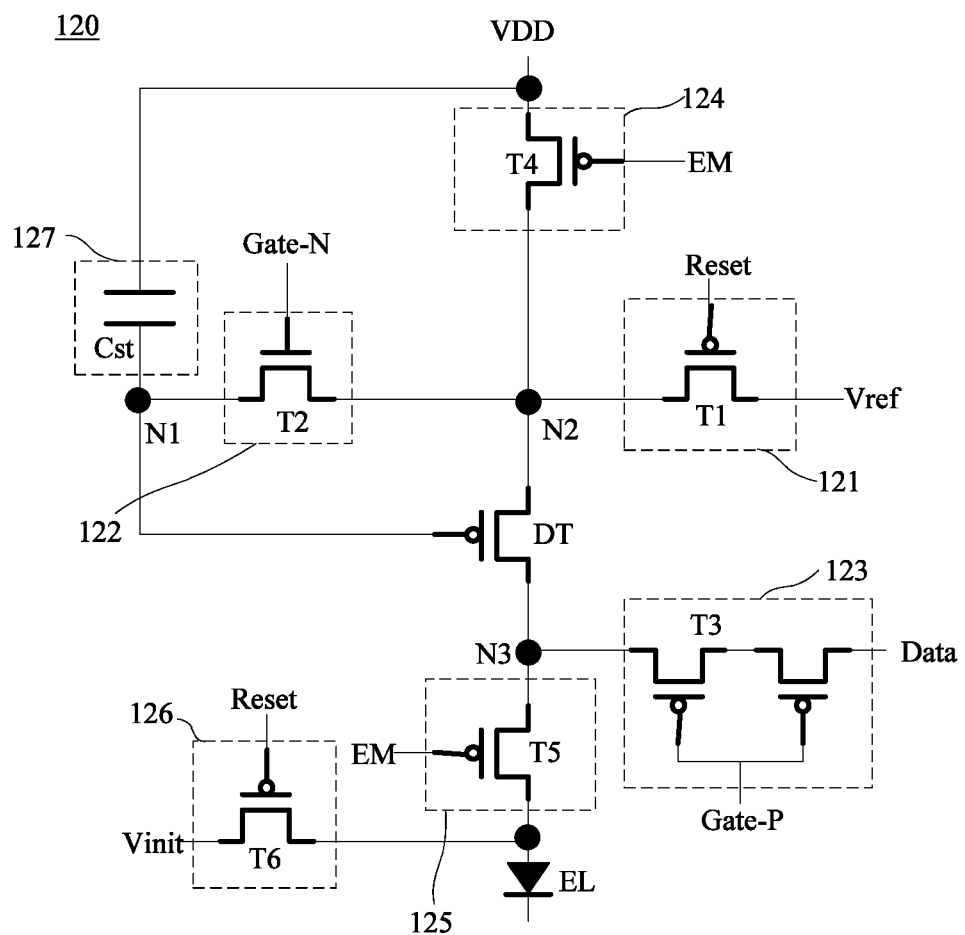
FIG. 7B is a structural diagram of yet another pixel circuit, in accordance with some embodiments.

In some embodiments, as shown in FIG. 7B, the third transistor T3 may be a double-gate transistor, so that the leakage current of the third transistor T3 may be reduced.

Figure 8:
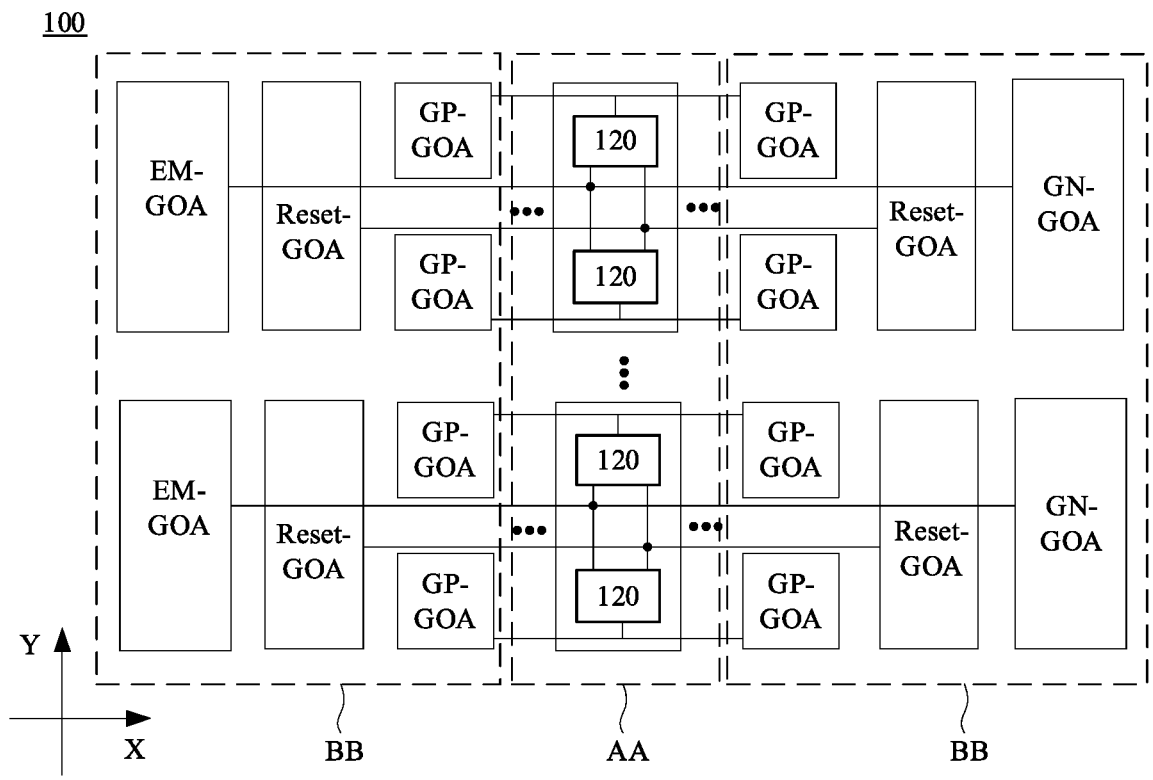
FIG. 8 is a diagram showing a connection relationship between shift registers and pixel circuits, in accordance with some embodiments.

In some embodiments, as shown in FIG. 8, the array substrate 100 provided by the embodiments of the present disclosure further includes first shift registers Reset-GOA, second shift registers GN-GOA, third shift registers GP-GOA and fourth shift registers EM-GOA.

A first shift register Reset-GOA is correspondingly connected to at least one row of pixel circuits 120 and is configured to transmit a first scanning signal to the at least one row of pixel circuits 120. Exemplarily, the first shift register Reset-GOA is electrically connected to two rows of pixel circuits 120 through a first scanning signal line RL. The first scanning signal line RL serves as the first scanning signal terminal Reset, and the control electrode of the first transistor T1 and the control electrode of the sixth transistor T6 are both electrically connected to the first scanning signal line RL (the first scanning signal terminal Reset). The first shift registers Reset-GOA are disposed on two opposite sides of the display area AA along the first direction X, that is, the first shift registers Reset-GOA adopt double-sided driving.

A second shift register GN-GOA is correspondingly connected to at least one row of pixel circuits 120 and is configured to transmit a second scanning signal to the at least one row of pixel circuits 120. Exemplarily, the second shift register GN-GOA is electrically connected to two rows of pixel circuits 120 through a second scanning signal line GNL. The second scanning signal line GNL serves as the second scanning signal terminal Gate-N, and the control electrode of the second transistor T2 is electrically connected to the second scanning signal line GNL (second scanning signal terminal Gate-N). The second shift registers GN-GOA are disposed on one side of the display area AA along the first direction X, that is, the second shift registers GN-GOA adopt single-side driving.

A third shift register GP-GOA is correspondingly connected to one row of pixel circuits 120 and is configured to transmit a third scanning signal to the one row of pixel circuits 120. Exemplarily, the third shift register GP-GOA is electrically connected to two rows of pixel circuits 120 through a third scanning signal line GPL. The third scanning signal line GPL serves as the third scanning signal terminal Gate-P, and the control electrode of the third transistor T3 is electrically connected to the third scanning signal line GPL (third scanning signal terminal Gate-P). The third shift registers GP-GOA are disposed on the two opposite sides of the display area AA along the first direction X, that is, the third shift registers GP-GOA adopt double-sided driving.

A fourth shift register EM-GOA is correspondingly connected to at least one row of pixel circuits 120 and is configured to transmit a fourth scanning signal to the at least one row of pixel circuits 120. Exemplarily, the fourth shift register EM-GOA is electrically connected to two rows of pixel circuits 120 through a fourth scanning signal line EML. The fourth scanning signal line EML serves as the light-emitting control signal terminal EM, i.e., a fourth scanning signal terminal EM, and the control electrode of the fourth transistor T4 and the control electrode of the fifth transistor T5 are both electrically connected to the fourth scanning signal line EML (fourth scanning signal terminal EM). The fourth shift registers EM-GOA are disposed on the other side of the display area AA along the first direction X, that is, the fourth shift registers EM-GOA adopt single-side driving.

In the display panel 1100 provided by the embodiments of the present disclosure, the first transistor T1 included in the reset sub-circuit 121 and the sixth transistor T6 included in the unset sub-circuit 126 share the first shift register Reset-GOA. In this way, one shift register can be reduced, which is beneficial to reduce the width of the peripheral area BB and realize the narrow frame of the display panel 1100.

Some other embodiments of the present disclosure provide a driving method for a pixel circuit 120, and the driving method is used to drive the pixel circuit 120 described in any one of the above-mentioned embodiments. As shown in FIG. 9, the driving method includes the following steps.

In the unset phase T11, the first scanning signal terminal Reset and the second scanning signal terminal Gate-N output operating levels, and the third scanning signal terminal Gate-P outputs a non-operating level; and the reference voltage signal from the reference voltage signal terminal Vref is transmitted to the control electrode N1 of the driving transistor DT via the reset sub-circuit 121 and the leakage prevention sub-circuit 122.

In the embodiments of the present disclosure, the operating level refers to a level signal capable of turning on a transistor electrically connected to a scanning signal terminal corresponding to the level signal, that is, driven by the operating level, there is a connection between a first and second electrodes of the corresponding transistor. The non-operating level refers to a level signal that turns off (cut off) a transistor electrically connected to a scanning signal terminal corresponding to the level signal, that is, driven by the non-operating level, there is a disconnection between a first and second electrodes of the corresponding transistor.

Exemplarily, taking the pixel circuit 120 shown in FIG. 7A as an example, in the case where the first transistor T1, the third transistor T3, the fourth transistor T4, the fifth transistor T5 and the sixth transistor T6 are all P-type transistors (the P-type transistor is turned on when its control electrode has low voltage and turned off when its control electrode has high voltage), for each of the first scanning signal terminal Reset, the third scanning signal terminal Gate-P and the light-emitting control signal terminal EM that are connected to the control electrodes of the above-mentioned first, third, fourth, fifth and sixth transistor T1, T3, T4, T5 and T6, the output operating level refers to a voltage signal with a low voltage value output from the corresponding signal terminal, and the output non-working level refers to a voltage signal with a high voltage value output by the corresponding signal terminal. For example, the third scanning signal terminal Gate-P electrically connected to the third transistor T3 outputs the operating level means that the third scanning signal terminal Gate-P outputs a voltage signal with a low voltage value; and the third scanning signal terminal Gate-P outputs the non-operating level means that the third scanning signal terminal Gate-P outputs a voltage signal with a high voltage value.

In the case where the second transistor T2 is an N-type transistor (the N-type transistor is turned on when its control electrode has high voltage and turned off when its control electrode has low voltage), the second scanning signal terminal Gate-N outputs the operating level means that the second scanning signal terminal Gate-N outputs a voltage signal with a high voltage value; and the second scanning signal terminal Gate-N outputs the non-operating level means that the second scanning signal terminal Gate-N outputs a voltage signal with a low voltage value. Embodiments of the present disclosure do not limit the specific voltage values of the operating level and the non-operating level, as long as the voltage value of the operating level can fully turn on the corresponding transistor.

In the unset phase T11, the first scanning signal terminal Reset outputs an operating level, and the reset sub-circuit 121 electrically connected to the first scanning signal terminal Reset is turned on; that is, in a case where the reset sub-circuit 121 includes a first transistor T1, the first transistor T1 is turned on; and the first transistor T1 transmits the reference voltage signal from the reference voltage signal terminal Vref to the first electrode N2 of the driving transistor DT.

In a case where the pixel circuit 120 includes an unset sub-circuit 126, and the unset sub-circuit 126 includes a sixth transistor T6, in the unset phase T11, the sixth transistor T6 and the first transistor T1 are synchronously turned on, and the sixth transistor T6 transmits an initialization signal from the initialization signal terminal Vinit to the anode of the light-emitting device EL, and resets a voltage of the anode of the light-emitting device EL. The first transistor T1, together with the second transistor T2, resets a voltage of the control electrode N1 of the driving transistor DT (refer to the above, and will not be repeated here).

The second scanning signal terminal Gate-N outputs an operating level, and the leakage prevention sub-circuit 122 electrically connected to the second scanning signal terminal Gate-N is turned on, and in a case where the leakage prevention sub-circuit 122 includes a second transistor T2, and the second transistor T2 is an N-type transistor, the second scanning signal terminal Gate-N outputs an operating level with a high voltage to a control electrode of the second transistor T2, the second transistor T2 is turned on, and the second transistor T2 transmits the reference voltage signal transmitted to the first electrode N2 of the driving transistor DT via the first transistor T1 to the control electrode N1 of the driving transistor DT, so as to reset the voltage of the control electrode N1 of the driving transistor DT.

In the data writing phase T12, the first scanning signal terminal Reset outputs a non-operating level, the second scanning signal terminal Gate-N and the third scanning signal terminal Gate-P output operating levels, and the data signal terminal Data outputs a data signal. The data signal is transmitted to the second electrode N3 of the driving transistor DT via the data writing sub-circuit 123, and the data signal and the threshold voltage are written to the control electrode N1 of the driving transistor DT.

The first scanning signal terminal Reset outputs the non-operating level, and the reset sub-circuit 121 and the unset sub-circuit 126 that are electrically connected to the first scanning signal terminal Reset are turned off, that is, the first transistor T1 and the sixth transistor T6 are turned off.

The second scanning signal terminal Gate-N outputs the operating level, and the leakage prevention sub-circuit 122 electrically connected to the second scanning signal terminal Gate-N remains turned on, that is, the second transistor T2 remains at an on state.

The third scanning signal terminal Gate-P outputs the operating level, and the data writing sub-circuit 123 electrically connected to the third scanning signal terminal Gate-P is turned on. In a case where the data writing sub-circuit 123 includes a third transistor T3, the third transistor T3 is turned on, and the third transistor T3 transmits the data signal from the data signal terminal Data to the second electrode N3 of the driving transistor DT. The data signal is transmitted from the second electrode N3 of the driving transistor DT to the first electrode N2 of the driving transistor DT after being compensated by the driving transistor DT, and then the data signal and the threshold voltage are transmitted from first electrode N2 of the driving transistor DT to the control electrode N1 of the driving transistor DT via the second transistor T2.

In the first reset phase T13, the first scanning signal terminal Reset outputs an operating level at least once, the second scanning signal terminal Gate-N outputs a non-operating level, and the reference voltage signal is transmitted to the first electrode N2 of the driving transistor DT via the reset sub-circuit 121 to reset the voltage of the first electrode N2 of the driving transistor DT.

The first scanning signal terminal Reset outputs the operating level, and the reset sub-circuit 121 electrically connected to the first scanning signal terminal Reset is turned on, that is, the first transistor T1 is turned on. The first transistor T1 transmits the reference voltage signal from the reference voltage signal terminal Vref to the first electrode N2 of the driving transistor DT. The second scanning signal terminal Gate-N outputs the non-operating level, and the leakage prevention sub-circuit 122 electrically connected to the second scanning signal terminal Gate-N is turned off, that is, the second transistor T2 is turned off, so the reference voltage signal cannot be written to the control electrode of the driving transistor DT via the leakage prevention sub-circuit 122, which in turn resets the voltage only to the first electrode N2 of the driving transistor DT.

In the driving method for the pixel circuit 120 provided in embodiments of the present disclosure, as described above, in the unset phase T11, the voltage of the control electrode N1 of the driving transistor DT is able to be reset by the reset sub-circuit 121 (the first transistor T1) and the leakage prevention sub-circuit 122 (the second transistor T2), and in the first reset phase T13, the voltage of the first electrode N2 of the driving transistor DT is able to be reset by the reset sub-circuit 121. In this way, similar to the pixel circuit in any of the above-mentioned embodiments, the driving method for the pixel circuit provided by the present application may reduce the pixel circuit 120 by one unset transistor, which is beneficial to reduce the space occupied by the pixel circuit 120 and improve the pixel density of the display panel 1100.

In some embodiments, as shown in FIG. 9, in the first reset phase T13, the first scanning signal terminal Reset may output the operating level once. In this way, the reset sub-circuit 121 resets the voltage of the first electrode N2 of the driving transistor DT once, which is beneficial to shorten the duration of the first reset phase T13, and further increase the refresh rate of the display panel 1100.

Alternatively, in some other embodiments, as shown in FIG. 10, in the first reset phase T13, the first scanning signal terminal Reset may output the operating level twice. In this way, the reset sub-circuit 121 resets the voltage of the first electrode N2 of the driving transistor DT twice, which is beneficial for the reference voltage signal to be more fully transmitted to the first electrode N2 of the driving transistor DT.

Of course, in some other embodiments, in the first reset phase T13, the first scanning signal terminal Reset can also output the operating level more times, for example, three times, four times, or more times, the embodiments of the present disclosure do not specifically limit this.

In some embodiments, as shown in FIG. 9 and FIG. 10, the driving method for the pixel circuit further includes: in the first reset phase T13, outputting, by the third scanning signal terminal Gate-P, a non-operating level signal. That is to say, in the first reset phase T13, the data writing sub-circuit is turned off, which is beneficial to simplify the driving method for the pixel circuit.

In some other embodiments, as shown in FIG. 11 and FIG. 12, the driving method for the pixel circuit further includes: in the first reset phase T13, outputting, by the third scanning signal terminal Gate-P, an operating level signal at least once, and outputting, by the data signal terminal, a first reset voltage signal.

That is to say, in the first reset phase T13, the data writing sub-circuit 123 is turned on, and the data signal terminal Data outputs the first reset voltage signal. In this way, the first reset voltage signal can be transmitted to the second electrode N3 of the driving transistor DT to reset the voltage of the second electrode N3 of the driving transistor DT. As a result, the influence of the data signal on the voltage of the second electrode N3 of the driving transistor DT is reduced, thereby reducing the risk of display brightness difference of the display panel 1100 caused by the change of the data signal, and reducing the risk of flickering on the display panel 1100.

Exemplarily, referring to FIG. 11, in the first reset phase T13, the third scanning signal terminal Gate-P outputs the operating level once, which is beneficial to shorten the duration of the first reset phase T13, and further increase the refresh rate of the display panel 1100.

Alternatively, as shown in FIG. 12, in the first reset phase T13, the third scanning signal terminal Gate-P outputs the operating level twice. In this way, the data writing sub-circuit 123 resets the voltage of the second electrode N3 of the driving transistor DT twice, which is beneficial for the first reset voltage signal to be more fully transmitted to the second electrode N3 of the driving transistor DT.

In some embodiments, the pixel circuit 120 may have a first refresh rate and a second refresh rate, and the first refresh rate is lower than the second refresh rate. That is, the display panel adopts a variable refresh rate (VRR) display technology. The display panel can select an appropriate refresh rate according to changes in usage scenarios, and the specific value of the refresh rate of the display panel is not specifically limited in the embodiments of the present disclosure. Exemplarily, the first refresh rate may be, for example, 1 Hz or 30 Hz; and the second refresh rate may be, for example, 60 Hz or 120 Hz.

Figure 13B:
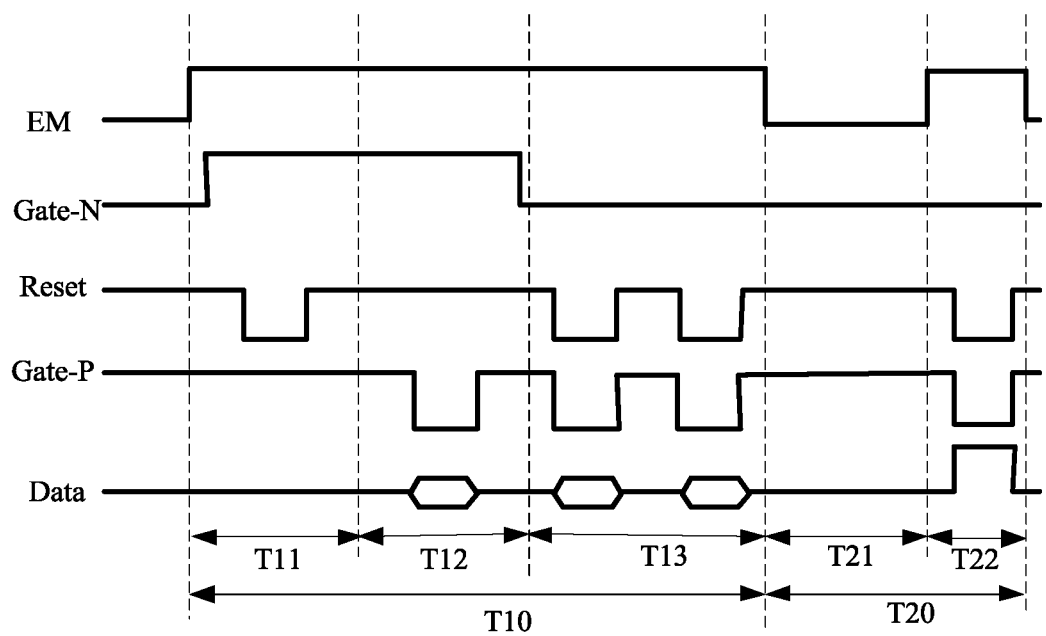
FIG. 13B is still yet another timing diagram of a pixel circuit, in accordance with some embodiments.

At the first refresh rate, the pixel circuit 120 further includes a light-emitting phase T21 and a second reset phase T22 that are after the first reset phase T13 in a display frame. As shown in FIG. 13A and FIG. 13B, the driving method for the pixel circuit 120 further includes the following steps.

In the light-emitting phase T21, the first scanning signal terminal Reset, the second scanning signal terminal Gate-N, and the third scanning signal terminal Gate-P output non-operating levels, the light-emitting control signal terminal EM outputs an operating level, and the driving current from the driving transistor DT is transmitted to the light-emitting device EL.

The first scanning signal terminal Reset outputs a non-operating level, and the first transistor T1 and the sixth transistor T6 electrically connected to the first scanning signal terminal Reset are turned off. The second scanning signal terminal Gate-N outputs a non-operating level, and the second transistor T2 electrically connected to the second scanning signal terminal Gate-N is turned off. The third scanning signal terminal Gate-P outputs a non-operating level, and the third transistor T3 electrically connected to the third scanning signal terminal Gate-P is turned off. The light-emitting control signal terminal EM outputs the operating level, and the fourth transistor T4 and the fifth transistor T5 electrically connected to the light-emitting control signal terminal EM are turned off. The driving transistor DT is turned on under the control of the voltages (the data signal and threshold voltage) of the control electrode N1.

The fourth transistor T4 transmits the first voltage signal from the first voltage signal terminal VDD to the first electrode N2 of the driving transistor DT, and the driving transistor DT generates a driving current under the control of the voltage difference between the control electrode N1 and the first electrode N2. The driving current is transmitted to the light-emitting device EL via the fifth transistor T5, and the light-emitting device EL is driven by the driving current to emit light.

In the second reset phase T22, the first scanning signal terminal Reset outputs an operating level, the second scanning signal terminal Gate-N and the light-emitting control signal terminal EM output non-operating levels, and the reference voltage signal from the reference voltage signal terminal Vref is transmitted to the first electrode N2 of the driving transistor DT via the reset sub-circuit 121.

The first scanning signal terminal Reset outputs the operating level, the first transistor T1 and the sixth transistor T6 connected to the first scanning signal terminal Reset are turned on, and the first transistor T1 transmits the reference voltage signal from the reference voltage signal terminal Vref to the first electrode N2 of the driving transistor DT to reset the voltage of the first electrode N2 of the driving transistor DT. In this way, the bias state of the driving transistor DT can be adjusted and the hysteresis effect of the driving transistor DT can be reduced. The sixth transistor T6 transmits the initialization signal from the initialization signal terminal Vinit to the anode of the light-emitting device EL to reset a voltage of the anode of the light-emitting device EL.

Exemplarily, according to the refresh rate of the display panel 1100, the hold frame T20 may include a plurality of light-emitting phases T21 and a plurality of second reset phases T22 which are arranged alternately. In the embodiments of the present disclosure, as shown in FIG. 13A and FIG. 13B, only one light-emitting phase T21 and one second reset phase T22 are shown as example.

In some embodiments, a voltage value of the reference voltage signal output by the reference voltage signal terminal Vref in the first reset phase T13 may be the same or different from the voltage value of the reference voltage signal output in the second reset phase T22. Exemplarily, the voltage value of the reference voltage signal from the reference voltage signal terminal is a first reference voltage signal value V1 in the first reset phase T13, and is a second reference voltage signal value V2 in the second reset phase T22.

Exemplarily, the first reference voltage signal value V1 is equal to the second reference voltage signal value V2, and the first reference voltage signal value V1 and the second reference voltage signal value V2 are negative values, so that the reference voltage signal terminal Vref outputs the reference voltage signal with the same magnitude in the first reset phase T13 and the second reset phase T22, which is beneficial to simplify the driving method for the reference voltage signal terminal, and further simplify the driving method for the pixel circuit.

Alternatively, the first reference voltage signal value is less than the second reference voltage signal value, and the first reference voltage signal value is a negative value, so that in the first reset phase T13, the reference voltage signal whose value is the first reference voltage signal value V1 can be used to reset the voltage of the first electrode N2 of the driving transistor DT. The second reference voltage signal value V2 is greater than a voltage value of the first voltage signal from the first voltage signal terminal VDD, so that in the second reset phase T22, the second electrode N3 of the driving transistor DT serves as the source of the driving transistor DT, and the first electrode N2 of the driving transistor DT serves as the drain of the driving transistor DT; and in the light-emitting phase T21, the first electrode N2 of the driving transistor DT serves as the source of the driving transistor DT, and the second electrode N3 of the driving transistor DT serves as the drain of the driving transistor DT. That is to say, in the light-emitting phase T21 and the second reset phase T22, the source and drain of the driving transistor DT are reversed, so that the driving transistor DT is in two opposite bias states, which is beneficial to improve the hysteresis performance of the driving transistor DT, and reduce the risk of screen flickering on the display panel 1100.

In some embodiments, as shown in FIG. 13A, in the second reset phase T22, the third scanning signal terminal Gate-P outputs a non-operating level, and the data writing sub-circuit 123 is turned off in this case. The voltages of the first electrode N2 of the driving transistor DT and the anode of the light-emitting device EL are reset in the second reset phase T22.

In some other embodiments, as shown in FIG. 13B, in the second reset phase T22, the third scanning signal terminal Gate-P outputs an operating level, and the data signal terminal outputs a second reset voltage signal. In this case, the data writing sub-circuit 123 is turned on, and the second reset voltage signal is transmitted to the second electrode N3 of the driving transistor DT, so as to reset the voltage of the second electrode N3 of the driving transistor DT.

Exemplarily, the second reset voltage signal may be a high voltage signal with a positive voltage value, and the second reference voltage signal value V2 of the reference voltage signal output from the reference voltage signal terminal Vref may be a negative value. In this way, in the second reset phase, the second electrode N3 of the driving transistor DT serves as the source of the driving transistor DT, and the first electrode N2 serves as the drain of the driving transistor DT. Compared with that in the light-emitting phase T21, the source and drain of the driving transistor DT are reversed in the second reset phase, which is beneficial to reduce the hysteresis of the driving transistor DT.

It can be understood that the second reset voltage signal may also be adjusted according to the data signal in the data writing phase T12. For example, in a case where the refresh rate of the pixel circuit is 1 Hz, in the second reset phase, the magnitude of the second reset voltage signal may be dynamically adjusted according to the different gray scale displayed by the light-emitting device EL.

In some embodiments, referring to FIG. 3 and FIG. 14 to FIG. 22, the array substrate 100 further includes a first semiconductor layer 11, a first gate conductive layer 12, a second gate conductive layer 13, a second semiconductor layer 14, a third gate conductive layer 15, a first source-drain conductive layer 16 and a second source-drain conductive layer 17 which are sequentially disposed along a direction Z perpendicular to the substrate 110 and away from the substrate 110. The array substrate 100 further includes at least one insulating layer disposed between any two adjacent conductive layers, and the embodiments of the present disclosure will not describe the insulating layers included in the array substrate 100 one by one. In some embodiments, two adjacent pixel circuits 120 along the first direction X are arranged symmetrically. Based on this, FIG. 14 to FIG. 22 all show structures of two pixel circuits.

Figure 14:
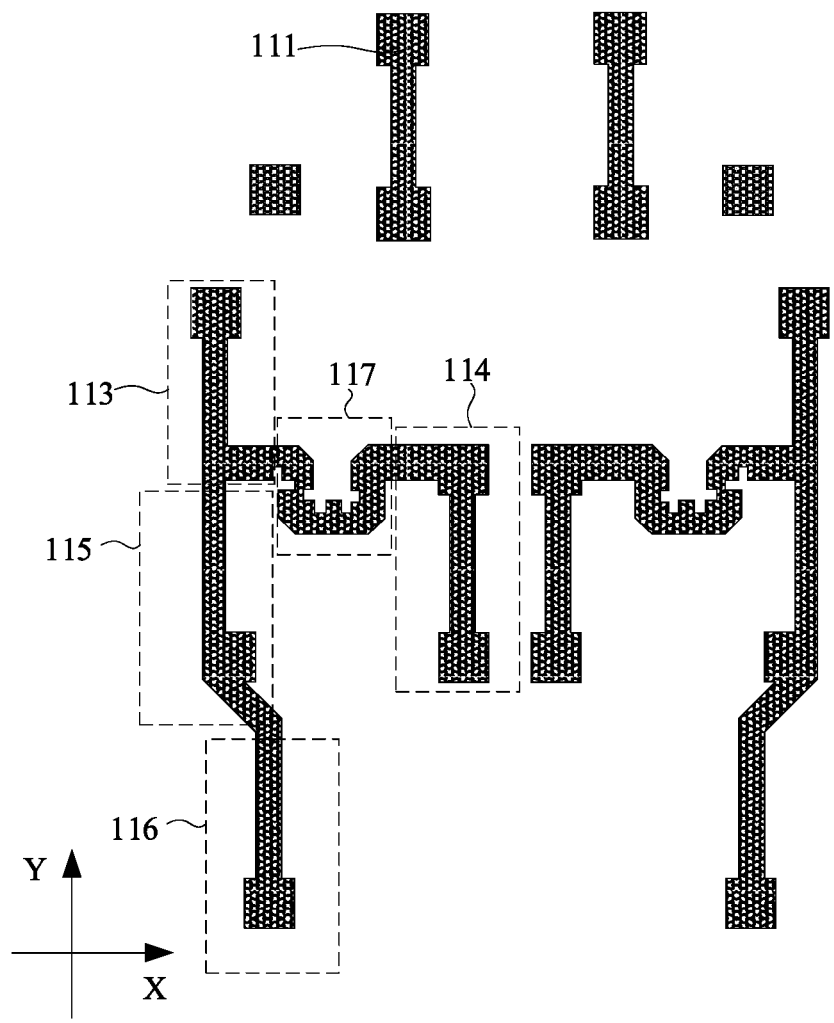
FIG. 14 to FIG. 22 are structural diagrams of an array substrate, in accordance with some embodiments.

Referring to FIG. 3 and FIG. 14, FIG. 14 is a structural diagram of the first semiconductor layer 11 in accordance with some embodiments. The first semiconductor layer 11 is disposed on the substrate (not shown in the figure), and includes a first semiconductor pattern 111 of the first transistor T1, a third semiconductor pattern 113 of the third transistor T3, and a seventh semiconductor pattern 117 of the driving transistor DT. The third semiconductor pattern 113 is connected to the seventh semiconductor pattern 117, for example, it may be a region of the third semiconductor pattern 113 for forming the second electrode of the third transistor T3 is connected to a region of the seventh semiconductor pattern 117 for forming the second electrode of the driving transistor DT, which facilitates the connection of the second electrode of the third transistor T3 and the second electrode of the driving transistor DT.

Certainly, in a case where the pixel circuit 120 further includes the fourth transistor T4, the fifth transistor T5 and the sixth transistor T6, as shown in FIG. 14, the first semiconductor layer 11 further includes a fourth semiconductor pattern 114 of the fourth transistor T4, a fifth semiconductor pattern 115 of the fifth transistor T5 and a sixth semiconductor pattern 116 of the sixth transistor T6.

Here, the third semiconductor pattern 113, the fourth semiconductor pattern 114, the fifth semiconductor pattern 115, the sixth semiconductor pattern 116 and the seventh semiconductor pattern 117 are connected to each other as a whole. That is, the third semiconductor pattern 113, the fourth semiconductor pattern 114, the fifth semiconductor pattern 115, the sixth semiconductor pattern 116 and the seventh semiconductor pattern 117 are each a portion of a continuous pattern.

Figure 15A:
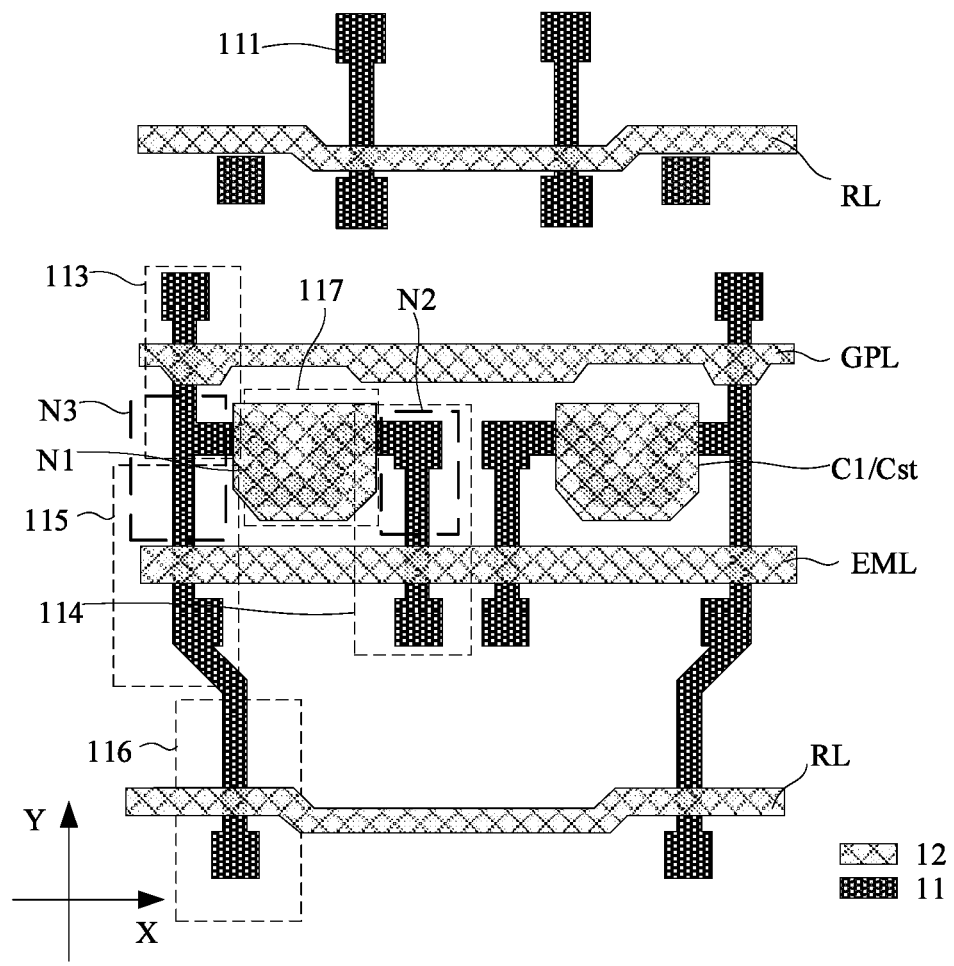

Referring to FIG. 3 and FIG. 15A, FIG. 15A is a structural diagram of the first gate conductive layer 12 and the first semiconductor layer 11. The first gate conductive layer 12 is located on a side of the first semiconductor layer 11 away from the substrate 110, and the first gate conductive layer 12 includes each first scanning signal line RL, each third scanning signal line GPL and a first electrode plate C1 of each storage capacitor Cst.

In the case where the pixel circuit 120 further includes the fourth transistor T4 and the fifth transistor T5, the first gate conductive layer 12 may further include the fourth scanning signal line EML.

As shown in FIG. 15A, an orthographic projection of the first scanning signal line RL on the substrate 110 partially overlaps with both an orthographic projection of the first semiconductor pattern 111 on the substrate 110 and an orthographic projection of the sixth semiconductor pattern 116 on the substrate 110, and a portion of the first scanning signal line RL having such an overlapped region is used to form control electrodes of the first transistor T1 and the sixth transistor T6. The first semiconductor pattern 111 includes: a semiconductor region of the first transistor T1 whose orthographic projection on the substrate 110 overlaps with the orthographic projection of the first scanning signal line RL on the substrate 110, and the first and second electrodes of the first transistor T1 located on two opposite sides of a first scanning signal line RL, in which the first electrode of the first transistor T1 is located on the upper side of the first scanning signal line RL and the second electrode of the first transistor T1 is located on the lower side of the first scanning signal line RL. The sixth semiconductor pattern 116 includes: a semiconductor layer of the sixth transistor T6 whose orthographic projection on the substrate 110 overlaps with the orthographic projection of the first scanning signal line RL on the substrate 110, the first electrode of the sixth transistor T6 located on the lower side of another first scanning signal line RL, and the second electrode of the sixth transistor T6 located on the upper side of the another first scanning signal line RL.

An orthographic projection of the third scanning signal line GPL on the substrate 110 partially overlaps with an orthographic projection of the third semiconductor pattern 113 on the substrate, and a portion of the third scanning signal line GPL having such an overlapped region is used to form the control electrode of the third transistor T3. The third semiconductor pattern 113 includes: a semiconductor region of the third transistor T3 whose orthographic projection on the substrate 110 overlaps with the orthographic projection of the third scanning signal line GPL on the substrate 110, the first electrode of the third transistor T3 located on the upper side of a third scanning signal line GPL, and the second electrode of the third transistor T3 located on the lower side of the third scanning signal line GPL.

An orthographic projection of the fourth scanning signal line EML on the substrate 110 partially overlaps with both an orthographic projection of the fourth semiconductor pattern 114 on the substrate 110 and an orthographic projection of the fifth semiconductor pattern 115 on the substrate 110, and a portion of the fourth scanning signal line EML having such an overlapped region is used to form the control electrodes of the fourth transistor T4 and the fifth transistor T5. The fourth semiconductor pattern 114 includes: a semiconductor region of the fourth transistor T4 whose orthographic projection on the substrate 110 overlaps with the orthographic projection of the fourth scanning signal line EML on the substrate 110, the first electrode of the fourth transistor T4 located on the lower side of a fourth scanning signal line EML, and the second electrode of the fourth transistor T4 located on the upper side of the fourth scanning signal line EML. The fifth semiconductor pattern 115 includes: a semiconductor region of a fifth transistor T5 whose orthographic projection on the substrate 110 overlaps with the orthographic projection of the fourth scanning signal line EML on the substrate 110, the first electrode of the fifth transistor T5 located on the upper side of the fourth scanning signal line EML, the second electrode of the fifth transistor T5 located on the lower side of the fourth scanning signal line EML.

Here, the second electrode of the third semiconductor pattern 113, the first electrode of the fifth semiconductor pattern 115 and the second electrode of the seventh semiconductor pattern 117 are connected together to form the second electrode N3 of the driving transistor DT. The second electrode of the fourth transistor T4 is connected to the first electrode N2 of the driving transistor DT.

Figure 15B:
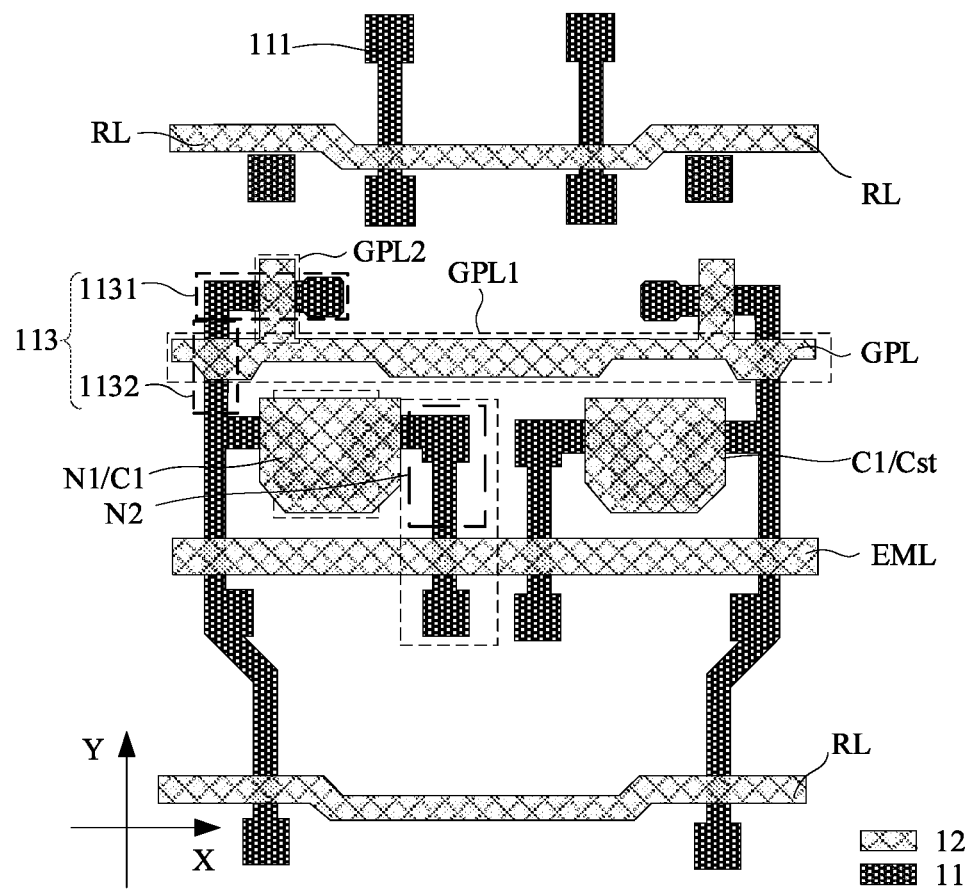

In some embodiments, refer to FIG. 15B, FIG. 15B is a structural diagram of the first semiconductor layer 11 and the first gate conductive layer 12 in a case where the third transistor T3 is a double-gate transistor. In the case where the third transistor T3 is a double-gate transistor, the third semiconductor pattern is of an L-shaped structure, and the third semiconductor pattern 113 includes a first extension segment 1131 and a second extension segment 1132. The first extension section 1131 extends along the first direction, and the second extension section 1132 extends along the second direction and is connected to the first extension section 1131.

The third scanning signal line GPL includes a main body GPL1 and protruding portions GPL2, in which the main body GPL1 extends along the first direction X and the protrusion portion GPL2 extends along the second direction Y. On the substrate 110, an orthographic projection of the main body GPL1 partially overlaps with an orthographic projection of the second extension section 1132, and an orthographic projection of the protruding portion GPL2 partially overlaps with an orthographic projection of the first extension section 1131.

Here, the data signal terminal Data is electrically connected to a portion of the first extension section 1131 located on a side of the protruding portion GPL2 away from the second extension section 1132.

Figure 16A:
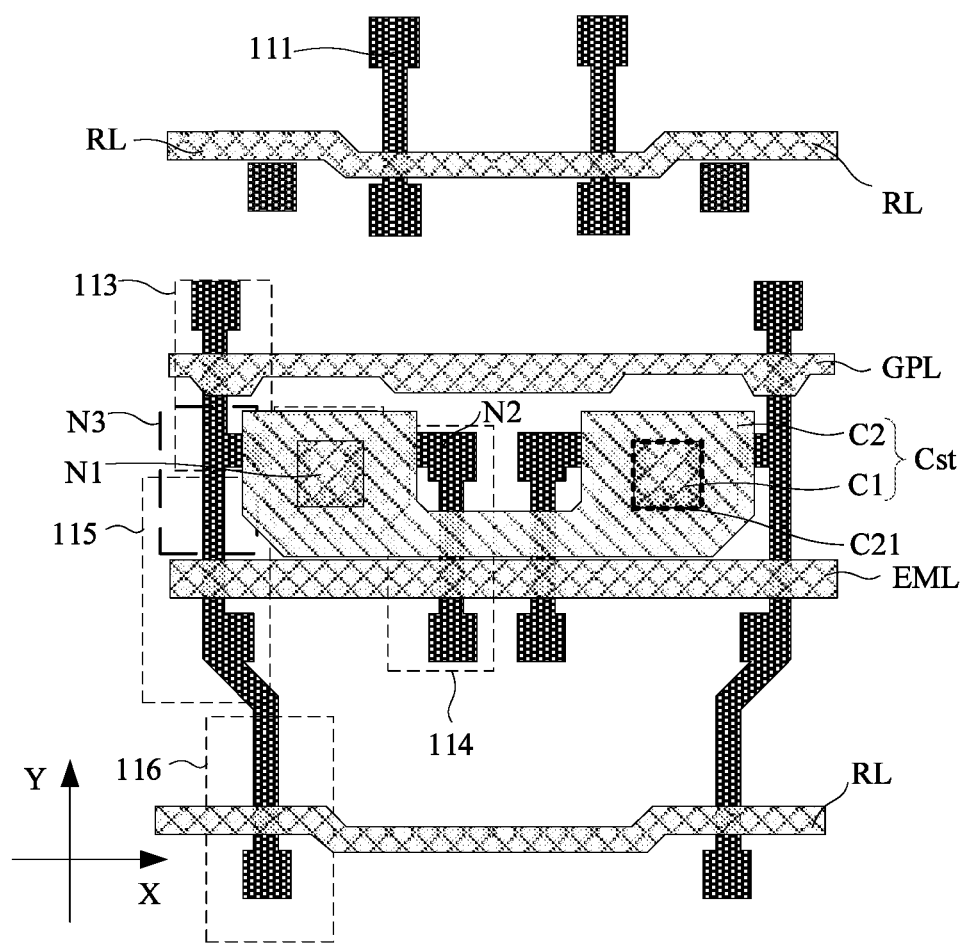

In some embodiments, referring to FIG. 3 and FIG. 16A, FIG. 16A is a structural diagram of the second gate conductive layer 13 without an auxiliary second scanning signal line GNL'. The second gate conductive layer 13 is located on a side of the first gate conductive layer away from the substrate 100. The second gate conductive layer 13 includes the second electrode plate C2 of the storage capacitor Cst. On the substrate 110, an orthographic projection of the second electrode plate C2 partially overlaps with an orthographic projection of the first electrode plate C1. Exemplarily, an avoidance hole C21 is provided in the middle of the second electrode plate C2.

Figure 16B:
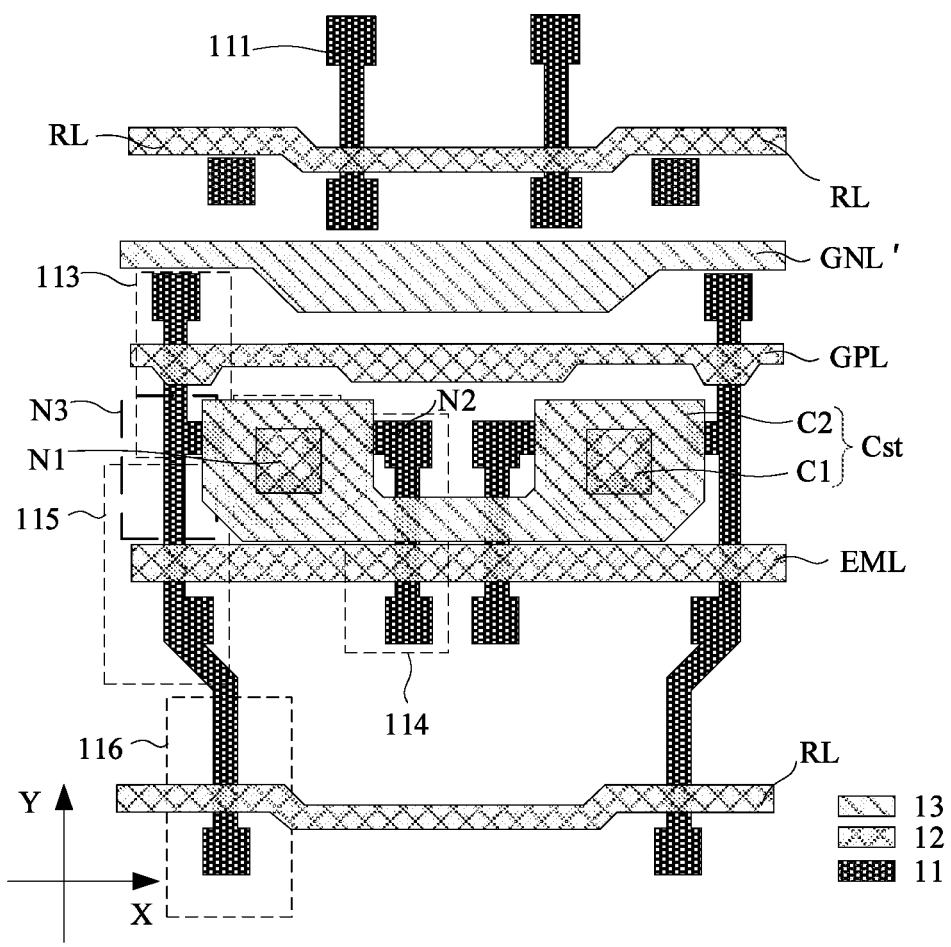

In some other embodiments, as shown in FIG. 16B, FIG. 16B is a structural diagram of the second gate conductive layer 13 including an auxiliary second scanning signal line GNL'. The second gate conductive layer 13 includes the second electrode plate C2 of the storage capacitor Cst, and the auxiliary second scanning signal line GNL'. The auxiliary second scanning signal line GNL' is configured to transmit the second scanning signal together with the second scanning signal line GNL.

Figure 17:
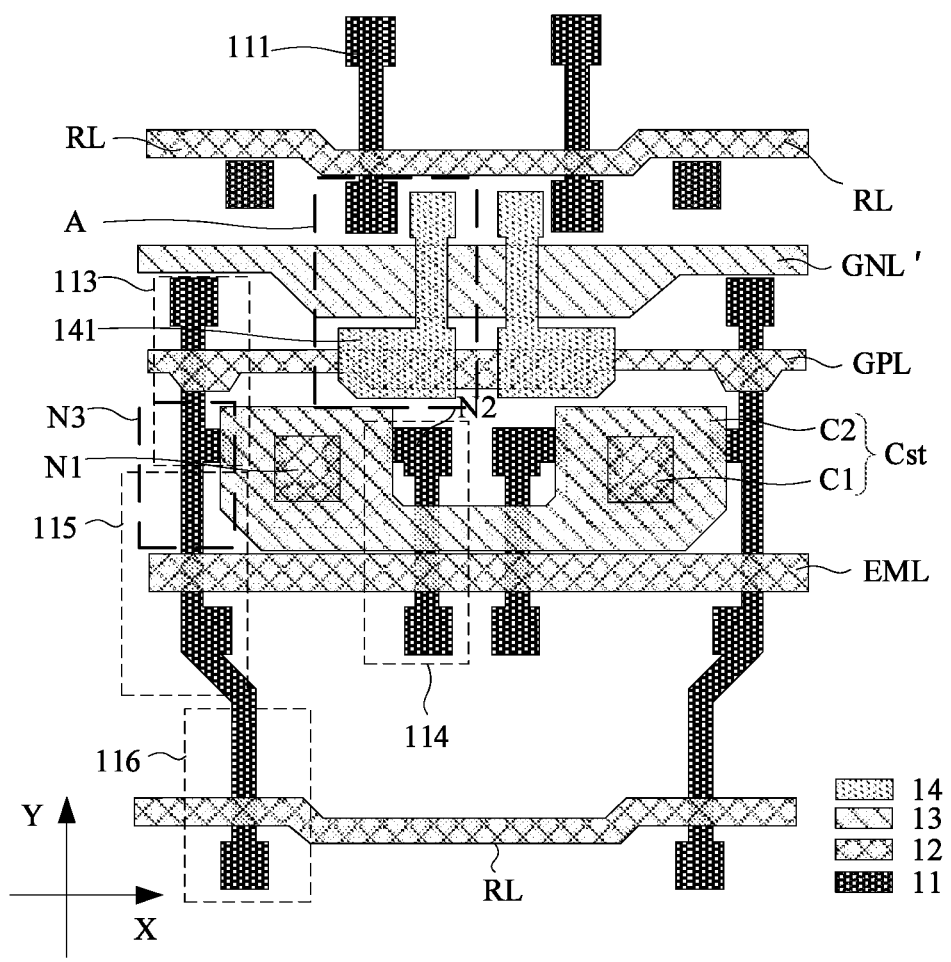

As shown in FIG. 3, the second semiconductor layer 14 is located on a side of the second gate conductive layer 13 away from the substrate. Referring to FIG. 17, FIG. 17 is a structural diagram of structures in the array substrate from the semiconductor layer 11 to the second semiconductor layer 14. The second semiconductor layer 14 includes a second semiconductor pattern 141 of the second transistor T2.

Figure 18A:
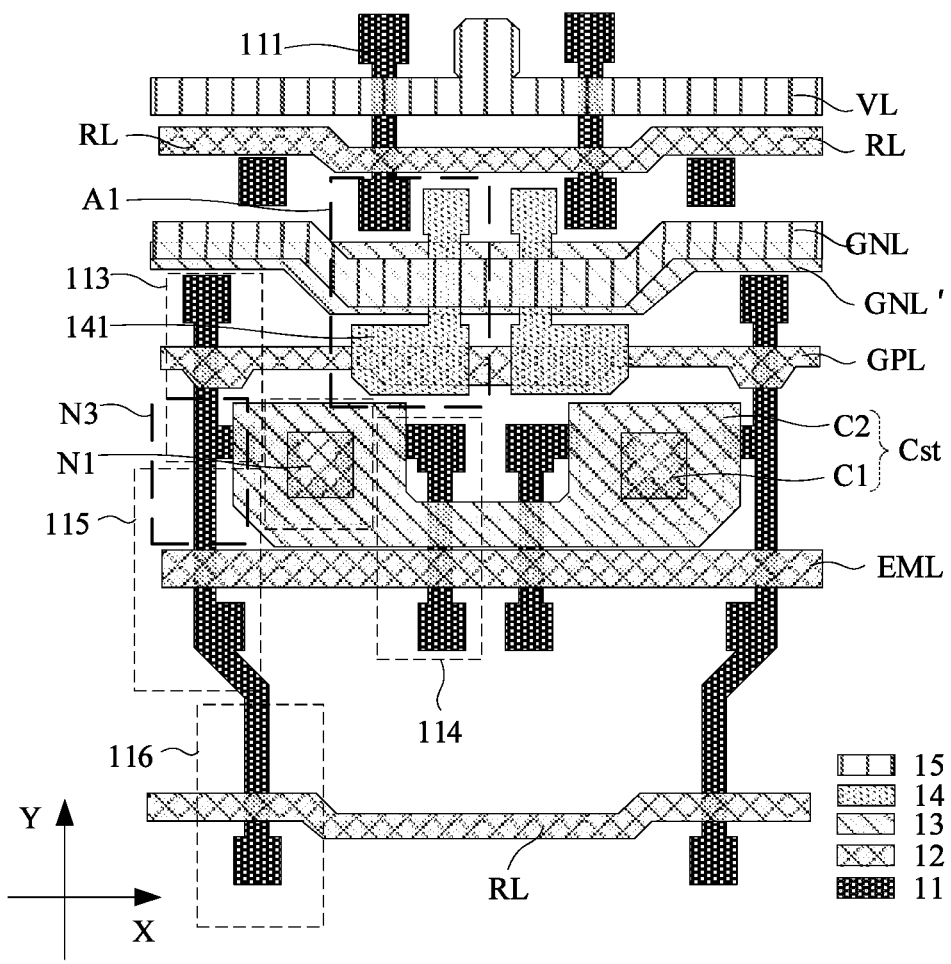

As shown in FIG. 3, the third gate conductive layer 15 is located on a side of the second semiconductor layer 14 away from the substrate 110. Referring to FIG. 18A, FIG. 18A is a structural diagram of structures in the array substrate from the first semiconductor layer to the third gate conductive layer. The third gate conductive layer 15 includes the second scanning signal line GNL and a reference voltage signal line VL.

Here, an orthographic projection of the second scanning signal line GNL on the substrate 110 partially overlaps with an orthographic projection of the second semiconductor pattern 141 on the substrate 110; and the second semiconductor pattern 141 includes: a semiconductor region of the second transistor T2 whose orthographic projection on the substrate 110 overlaps with the orthographic projection of the second scanning signal line GNL on the substrate 110, the first electrode of the second transistor T2 located on the upper side of the second scanning signal line GNL, and the second electrode of the second transistor T2 located on the lower side of the second scanning signal line GNL. The reference voltage signal line VL is used to transmit the reference voltage signal and serves as the reference voltage signal terminal Vref. Exemplarily, the orthographic projection of the second scanning signal line GNL on the substrate 110 overlaps at least partially with an orthographic projection of the auxiliary second scanning signal line GNL' on the substrate.

Figure 19A:
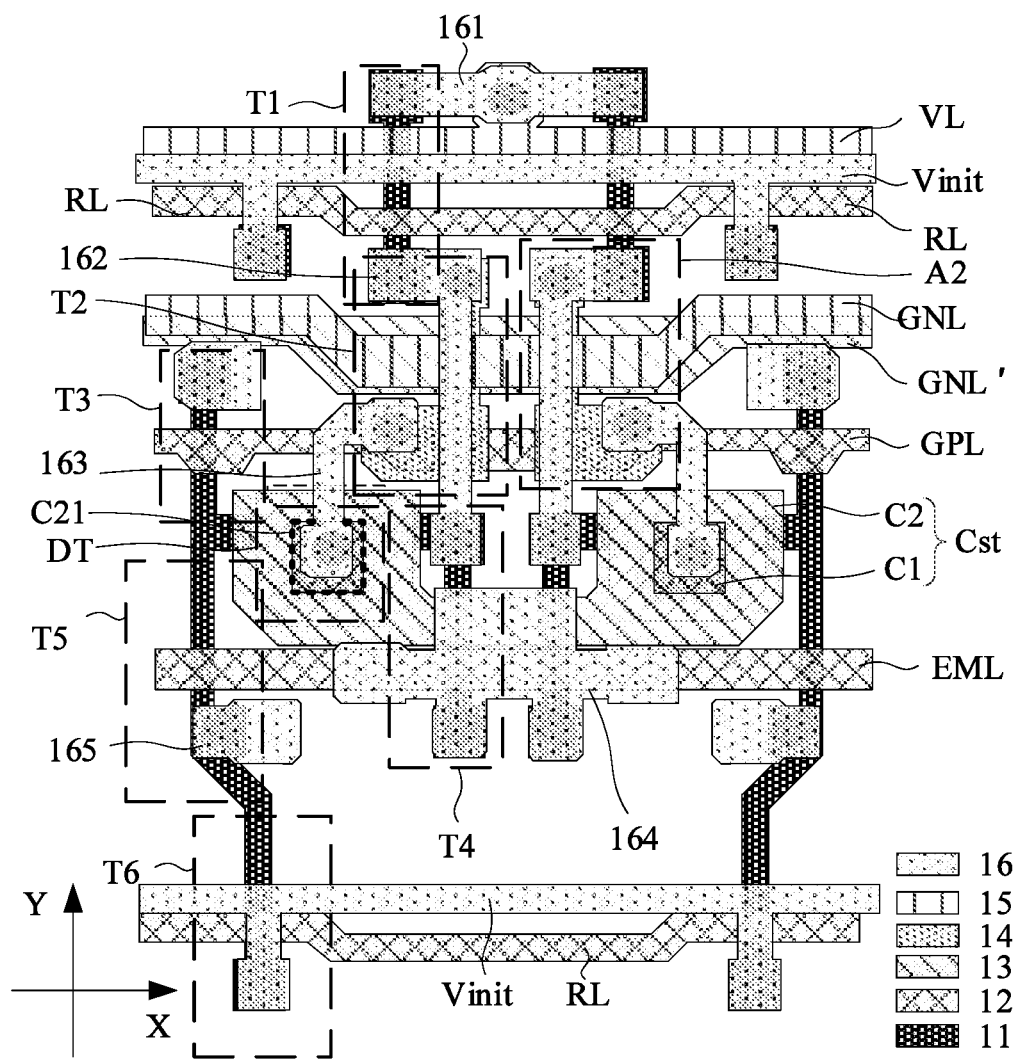

As shown in FIG. 3, the first source-drain conductive layer is located on a side of the third gate conductive layer 15 away from the substrate 110. Referring to FIG. 19A, FIG.

19A is a structural diagram of structures in the array substrate from the first semiconductor layer to the first source-drain conductive layer. The first source-drain conductive layer 16 includes first connection patterns 161, second connection patterns 162 and third connection patterns 163.

A first connection pattern 161 is connected to a reference voltage signal line VL and the first electrode of the first semiconductor pattern 111, so that the first electrode of the first transistor T1 is electrically connected to the reference voltage signal terminal Vref.

A second connection pattern 162 is connected to the second electrode of the first semiconductor pattern 111, the first electrode of the second semiconductor pattern 141 and the first electrode of the seventh semiconductor pattern 117, so that the second electrode of the first transistor T1 is electrically connected to both the first electrode of the second transistor T2 and the first electrode of the driving transistor DT. And in a case where the first semiconductor layer 11 includes the fourth semiconductor pattern 114, the second connection pattern 162 is further electrically connected to the second electrode of the fourth semiconductor pattern 114.

A third connection pattern 163 is connected to both the second electrode of the second semiconductor pattern 141 and the first electrode plate C1 of the storage capacitor Cst. An orthographic projection of the third connection pattern 163 on the substrate 110 partially overlaps with an orthogonal projection of an avoidance aperture C21 of the second electrode plate C2 of the storage capacitor Cst on the substrate 110, and the third connection pattern 163 passes through the avoidance hole C21 to connect to the first electrode plate C1.

In some embodiments, as shown in FIG. 19A, in the case where the pixel circuit 120 includes the fourth transistor T4, the first source-drain conductive layer 16 further includes fourth connection patterns 164, and a fourth connection pattern 164 is electrically connected to the first electrode of the fourth semiconductor pattern 114.

The first source-drain conductive layer 16 further includes fifth connection patterns 165, and a fifth connection pattern 165 is used for connecting a pixel circuit and an anode of a light-emitting device.

Figure 20:
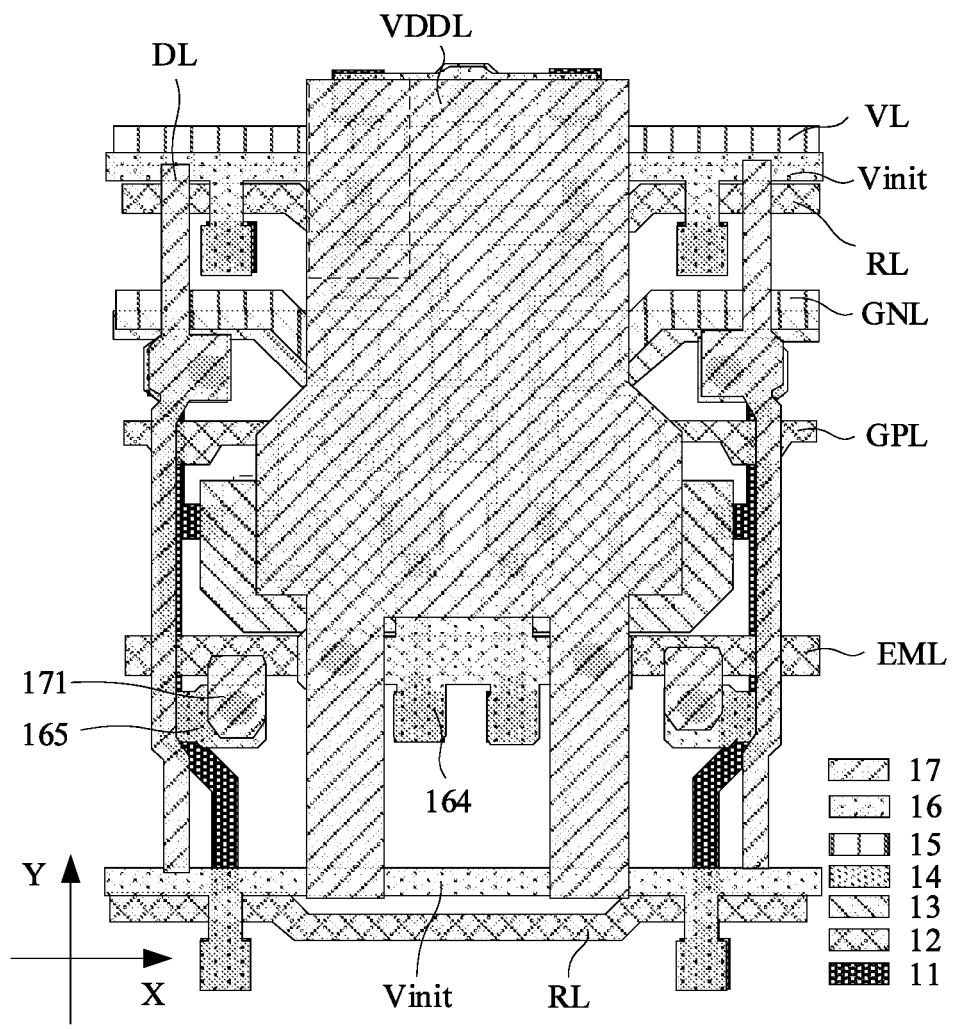

As shown in FIG. 3, the second source-drain conductive layer 17 is located on a side of the first source-drain conductive layer 16 away from the substrate 110. Referring to FIG. 20, FIG. 20 is a structural diagram of the array substrate, the second source-drain conductive layer 17 includes data lines DL, and a data line DL is connected to the first electrode (not shown in the figure) of the third semiconductor pattern. The second electrode of the third semiconductor pattern 113 is connected to the second electrode of the seventh semiconductor pattern 117 (as shown in FIG. 15A).

Continuing to refer to FIG. 20, the second source-drain conductive layer 17 may further include first voltage signal lines VDDL, a first voltage signal line VDDL serves a first voltage signal terminal VDD, and the first voltage signal line VDDL is electrically connected to the fourth connection pattern 164.

The second source-drain conductive layer 17 may further include transfer blocks 171, a transfer block 171 is connected to the fifth connection pattern 165, and used for connecting the pixel circuit 120 to the light-emitting device EL.

In some embodiments, referring to FIG. 17, on the substrate 110, an orthographic projection of the second semiconductor pattern 141 partially overlaps with an orthographic projection of the third scanning signal line GPL. Exemplarily, the second electrode of the second semiconductor pattern 141 overlaps with the third scanning signal line GPL, and the overlapping region provides a parasitic capacitance, and the second electrode of the second semiconductor pattern 141 is connected to the first electrode plate C1 of the storage capacitor Cst (as shown in FIG. 19A). In this way, a coupling effect between the third scanning signal line GPL and the first electrode plate C1 can be improved. When the third scanning signal line GPL outputs the third scanning signal, the voltage of the second electrode of the second semiconductor pattern 141 rises under the bootstrap effect of the capacitance, the voltage of the first electrode plate C1 rises, which is beneficial to improve the transmission efficiency of the data signal to the first electrode plate C1.

Figure 18B:
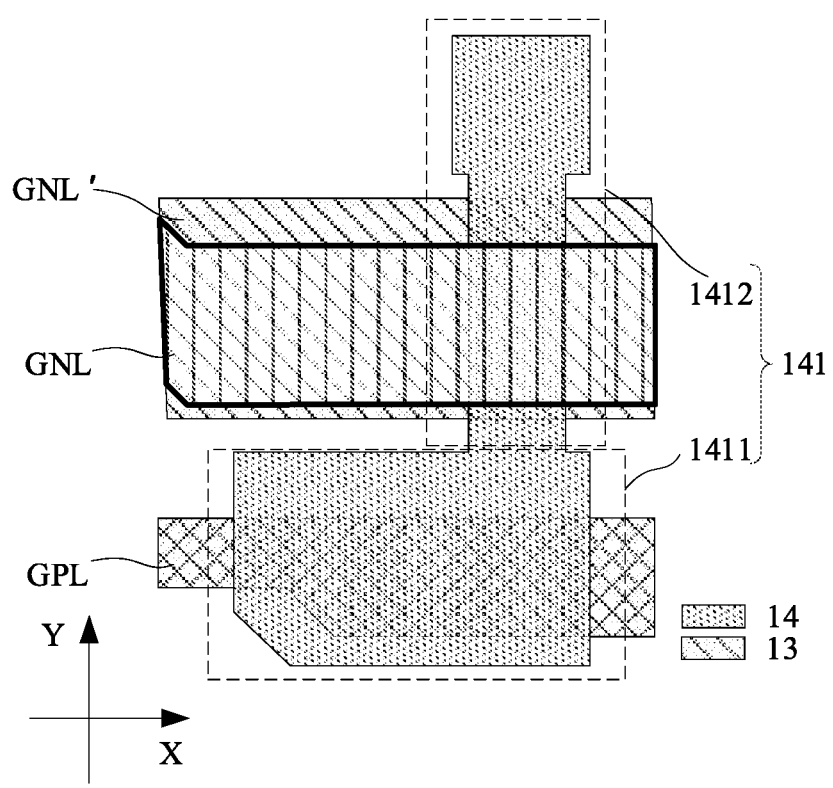

In some embodiments, as shown in FIG. 18A and FIG. 18B, FIG. 18B is a partial enlarged view of the A1 region in FIG. 18A. The second semiconductor pattern 141 includes a first portion 1411 and a second portion 1412.

On the substrate, an orthographic projection of the first portion 1411 is located on a side (lower side) of an orthographic projection of the second scanning signal line GNL proximate to an orthographic projection of the storage capacitor Cst, and the orthographic projection of the first portion 1411 overlaps the orthographic projection of the third scanning signal line GPL.

The second portion 1412 is connected to the first portion 1411 and extends along a second direction Y, where the second direction Y is perpendicular to the first direction X. On the substrate 110, an orthographic projection of the second portion 1412 intersects an orthographic projection of the second scanning signal line GNL. A portion of the second portion 1412 whose orthographic projection overlaps with the orthographic projection of the second scanning signal line GNL serves as a semiconductor region of the second transistor T2, and a portion of the second portion 1412 located on a side (upper side) of the second scanning signal line GNL away from the storage capacitor Cst serves as the first electrode of the second transistor T2.

As shown in FIG. 18B, along the second direction Y, a dimension of the first portion 1411 is greater than a dimension of the third scanning signal line GPL, and on the substrate 110, two ends of the orthographic projection of the first portion 1411 are located on two sides of the orthographic projection of the third scanning signal line GPL, respectively. Edges on two sides of the first portion 1411 along the first direction Y are located outside the third scanning signal line GPL, which is conducive to increasing a facing area of the second semiconductor pattern 141 and the third scanning signal line GPL, and improving the coupling function between the second electrode of the second semiconductor pattern 141 and the third scanning signal line GPL.

Figure 19B:
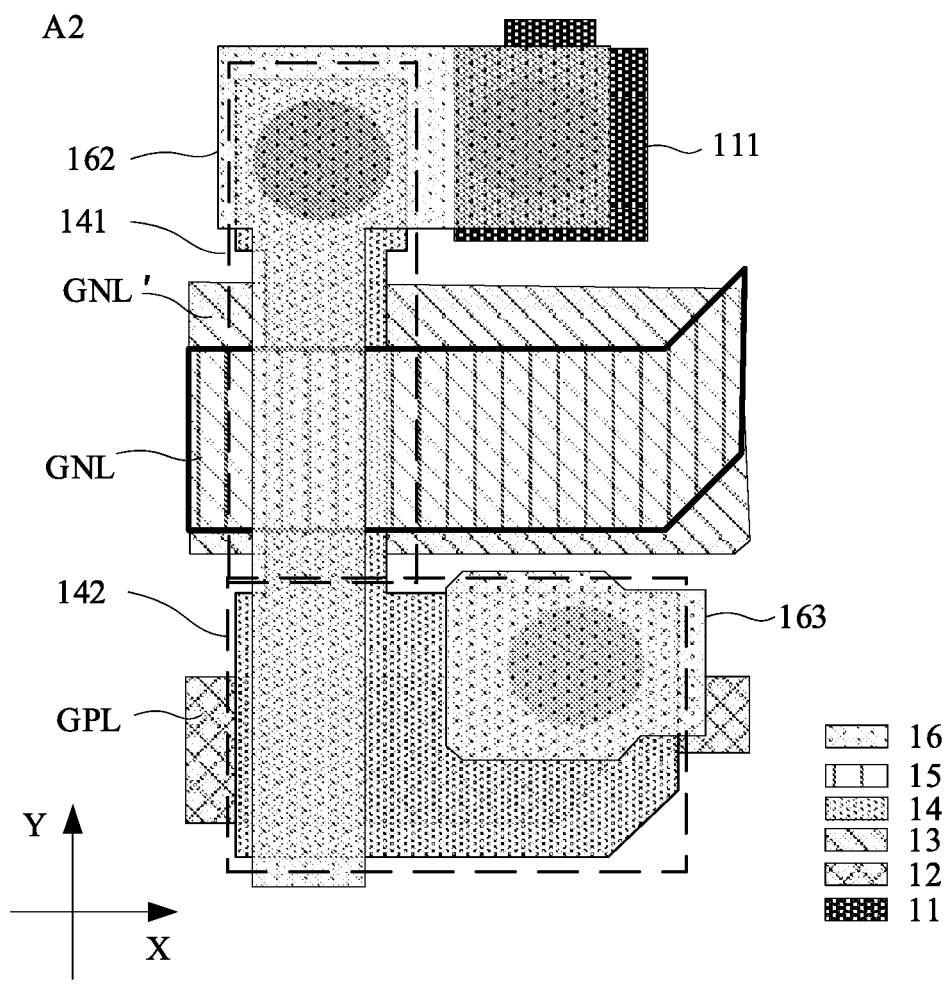

In some embodiments, as shown in FIG. 19A and FIG. 19B, FIG. 19B is a partial enlarged view of the region A2 in FIG. 19A, the second connection pattern 162 extends along the second direction Y, and on the substrate 110, the orthographic projection of the second portion 1412 overlaps with an orthographic projection of the second connection pattern 162. In this way, the second connection pattern 162 can shield or reduce the signal on the side of the first source-drain conductive layer away from the substrate 110 from interfering with the second semiconductor pattern 141.

Figure 21:
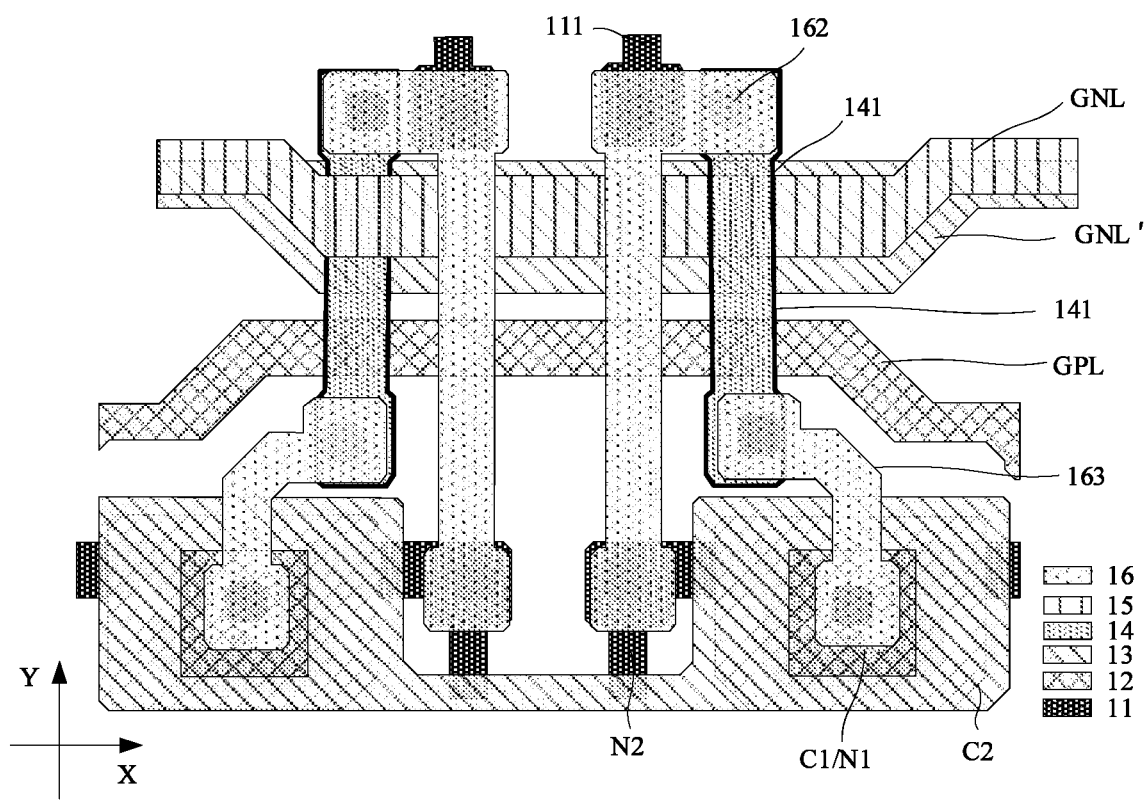

In some embodiments, as shown in FIG. 21, FIG. 21 is a structural diagram showing that the second semiconductor pattern 141 is separated from the second connection pattern.

The second semiconductor pattern 141 extends along the second direction Y, and on the substrate, an orthographic projection of the second semiconductor pattern 141 is separated from an orthographic projection of the second connection pattern 162. In this way, the second semiconductor pattern 141 forms an elongated structure, which is beneficial to simplify the structure of the second semiconductor pattern 141, thereby reducing the difficulty of manufacturing the second semiconductor pattern 141 and reducing the difficulty of manufacturing the display panel 1100.

In some embodiments, as shown in FIG. 19A and FIG. 19B, on the substrate 110, the orthographic projection of the third connection pattern 163 partially overlaps with the orthographic projection of the third scanning signal line GPL.

Figure 22:
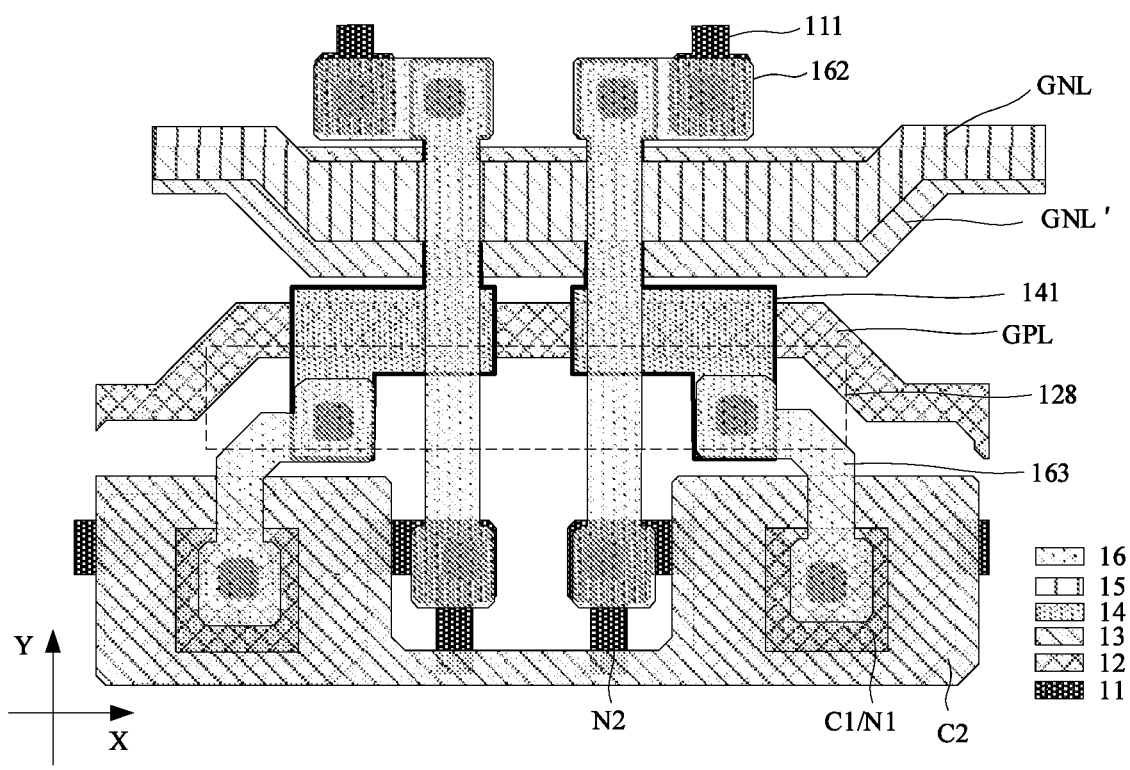

In some other embodiments, referring to FIG. 22, FIG. 22 is a structural diagram showing that the third connection pattern is located below the third scanning signal line GPL. On the substrate, an orthographic projection of the third connection pattern 163 is located on a side (the lower side) of an orthographic projection of the third scanning signal line GPL proximate to an orthographic projection of the storage capacitor Cst; and the orthographic projection of the third connection pattern 163 partially overlaps with the orthographic projection of the second semiconductor pattern 141, and the overlapping portion of the third connection pattern 163 and the second semiconductor pattern 141 is located on a side of the orthographic projection of the third scanning signal line GPL proximate to the orthographic projection of the storage capacitor Cst.

Referring to FIG. 22, a portion of the third scanning signal line GPL is bent toward a side (the upper side) away from the storage capacitor Cst to form a concave portion 128, and a portion where the third connection pattern 163 and the second semiconductor pattern 141 overlap each other on the substrate is located in a region defining by the concave portion 128.

In some embodiments, as shown in FIG. 3, the light-emitting device EL includes an anode 18, a light-emitting functional layer 18 and a cathode layer 21 that are disposed in sequence in a direction perpendicular to the substrate 110 and away from the substrate 110. The pixel circuit 120 is electrically connected to the anode 18 of the light-emitting device EL through a transfer block 171.

For example, as shown in FIG. 3, the encapsulation layer 200 may include a first inorganic material layer 201, an organic material layer 202 and a second inorganic material layer 203 that are disposed in sequence in the direction perpendicular to the substrate 110 and away from the substrate 110. Among them, the first inorganic material layer 201 and the second inorganic material layer 203 can isolate water and oxygen, reduce external water and oxygen from corroding each film layer structure below the encapsulation layer 200 (close to the substrate 11), especially reduce the risk of water and oxygen corroding the light-emitting functional layer 19, thereby increasing the service life of the display panel 1100; the organic material layer 202 can be used to planarize a light-emitting surface of the display panel 1100, and can be used to absorb and release the stress of the display panel 1100.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A pixel circuit, comprising:
a driving transistor including a control electrode, a first electrode and a second electrode;
a reset sub-circuit, electrically connected to a first scanning signal terminal, a reference voltage signal terminal and the first electrode of the driving transistor, and configured to, under control of a first scanning signal from the first scanning signal terminal, transmit a reference voltage signal from the reference voltage signal terminal to the first electrode of the driving transistor;
a leakage prevention sub-circuit, electrically connected to a second scanning signal terminal, and the first electrode and the control electrode of the driving transistor, and configured to, under control of a second scanning signal from the second scanning signal terminal, connect the first electrode of the driving transistor to the control electrode of the driving transistor; and
a data writing sub-circuit, electrically connected to a third scanning signal terminal, a data signal terminal and the second electrode of the driving transistor, and configured to, under control of a third scanning signal from the third scanning signal terminal, transmit a data signal from the data signal terminal to the second electrode of the driving transistor, wherein
the reset sub-circuit and the data writing sub-circuit are configured to, under the control of respective scanning signals, be turned on sequentially in a case where the leakage prevention sub-circuit is turned on;
the reset sub-circuit is configured to, under the control of the first scanning signal, be turned on at least once in a case where the leakage prevention sub-circuit is turned off; and
in the case where the leakage prevention sub-circuit is turned off, the data writing sub-circuit is configured to, under the control of the third scanning signal, be turned on at least once, and the data signal terminal is configured to output a first reset voltage signal.

2. The pixel circuit according to claim 1, wherein
the reset sub-circuit includes a first transistor, wherein a control electrode of the first transistor is electrically connected to the first scanning signal terminal, a first electrode of the first transistor is electrically connected to the reference voltage signal terminal, and a second electrode of the first transistor is electrically connected to the first electrode of the driving transistor;
the leakage prevention sub-circuit includes a second transistor, wherein a control electrode of the second transistor is electrically connected to the second scanning signal terminal, a first electrode of the second transistor is electrically connected to the first electrode of the driving transistor, and a second electrode of the second transistor is electrically connected to the control electrode of the driving transistor; and
the data writing sub-circuit includes a third transistor, wherein a control electrode of the third transistor is electrically connected to the third scanning signal terminal, a first electrode of the third transistor is electrically connected to the data signal terminal, and a second electrode of the third transistor is electrically connected to the second electrode of the driving transistor.

3. The pixel circuit according to claim 2, wherein the second transistor is a metal oxide thin film transistor; and the first transistor, the third transistor and the driving transistor are low temperature polysilicon thin film transistors.

4. The pixel circuit according to claim 1, further comprising:
a first control sub-circuit, electrically connected to a light-emitting control signal terminal, a first voltage signal terminal and the first electrode of the driving transistor, and configured to, under control of a light-emitting control signal from the light-emitting control signal terminal, transmit a first voltage signal from the first voltage signal terminal to the first electrode of the driving transistor;
a second control sub-circuit, electrically connected to the light-emitting control signal terminal and the second electrode of the driving transistor, wherein the second control sub-circuit is configured to be electrically connected to a light-emitting device, and under the control of the light-emitting control signal, transmit a driving current from the driving transistor to the light-emitting device;
an unset sub-circuit, electrically connected to the first scanning signal terminal and an initialization signal terminal, wherein the unset sub-circuit is configured to be electrically connected to the light-emitting device, and under the control of the first scanning signal, transmit an initialization signal from the initialization signal terminal to the light-emitting device; and
an energy storage sub-circuit, electrically connected to the control electrode of the driving transistor and the first voltage signal terminal, and configured to maintain a voltage of the control electrode of the driving transistor.

5. The pixel circuit according to claim 4, wherein
the first control sub-circuit includes a fourth transistor, wherein a control electrode of the fourth transistor is electrically connected to the light-emitting control signal terminal, a first electrode of the fourth transistor is electrically connected to the first voltage signal terminal, and a second electrode of the fourth transistor is electrically connected to the first electrode of the driving transistor;
the second control sub-circuit includes a fifth transistor, wherein a control electrode of the fifth transistor is electrically connected to the light-emitting control signal terminal, a first electrode of the fifth transistor is electrically connected to the second electrode of the driving transistor, and a second electrode of the fifth transistor is configured to be electrically connected to the light-emitting device;
the unset sub-circuit includes a sixth transistor, wherein a control electrode of the sixth transistor is electrically connected to the first scanning signal terminal, a first electrode of the sixth transistor is electrically connected to the initialization signal terminal, and a second electrode of the sixth transistor is configured to be electrically connected to the light-emitting device; and
the energy storage sub-circuit includes a storage capacitor, wherein a first electrode plate of the storage capacitor is electrically connected to the control electrode of the driving transistor, and a second electrode plate of the storage capacitor is electrically connected to the first voltage signal terminal.

6. A driving method for the pixel circuit according to claim 1, a display frame including an unset phase, a data writing phase and a first reset phase; the driving method comprising:

in the unset phase: outputting, by the first scanning signal terminal and the second scanning signal terminal, operating levels; outputting, by the third scanning signal terminal, a non-operating level; and transmitting the reference voltage signal from the reference voltage signal terminal to the control electrode of the driving transistor via the reset sub-circuit and the leakage prevention circuit;
in the data writing phase: outputting, by the first scanning signal terminal, a non-operating level; outputting, by the second scanning signal terminal and the third scanning signal terminal, operating levels; outputting, by the data signal terminal, the data signal; transmitting the data signal to the second electrode of the driving transistor via the data writing sub-circuit; and writing the data signal and a threshold voltage to the control electrode of the driving transistor;
in the first reset phase: outputting, by the first scanning signal terminal, an operating level at least once; outputting, by the second scanning signal terminal, a non-operating level; and transmitting the reference voltage signal to the first electrode of the driving transistor via the reset sub-circuit; and
in the first reset phase: outputting, by the third scanning signal terminal, an operating level at least once; and transmitting the first reset voltage signal to the second electrode of the driving transistor via the data writing sub-circuit.

7. The driving method according to claim 6, wherein the pixel circuit has a first refresh rate and a second refresh rate, the first refresh rate is lower than the second refresh rate; the display frame further includes, at the first refresh rate, a light-emitting phase and a second reset phase that are after the first reset phase;
the driving method further comprises:
in the light-emitting phase: outputting, by the first scanning signal terminal, the second scanning signal terminal and the third scanning signal terminal, non-operating levels; outputting, by a light-emitting control signal terminal, an operating level; and transmitting a driving current from the driving transistor to a light-emitting device; and
in the second reset phase: outputting, by the first scanning signal terminal, an operating level; outputting, by the second scanning signal terminal, the third scanning signal terminal and the light-emitting control signal terminal, non-operating levels; and transmitting the reference voltage signal from the reference voltage signal terminal to the first electrode of the driving transistor via the reset sub-circuit.

8. The driving method according to claim 7, wherein a voltage value of the reference voltage signal from the reference voltage signal terminal is a first reference voltage signal value in the first reset phase, and is a second reference voltage signal value in the second reset phase, wherein
the first reference voltage signal value is equal to the second reference voltage signal value, and the first reference voltage signal value and the second reference voltage signal value are negative values; or the first reference voltage signal value is less than the second reference voltage signal value, the first reference voltage signal value is a negative value, and the second reference voltage signal value is greater than a voltage value of the first voltage signal from the first voltage signal terminal.

9. An array substrate, comprising: a substrate, and a plurality of pixel circuits disposed on the substrate and arranged in an array, the pixel circuits each being the pixel circuit according to claim 1.

10. The array substrate according to claim 9, wherein the pixel circuit includes the driving transistor, a first transistor, a third transistor and a storage capacitor;

the array substrate further comprises:
a first semiconductor layer, disposed on the substrate, and including a first semiconductor pattern of the first transistor, a third semiconductor pattern of the third transistor, and a seventh semiconductor pattern of the driving transistor, wherein the third semiconductor pattern is connected to the seventh semiconductor pattern and has a gap from the first semiconductor pattern;
a first gate conductive layer, located on a side of the first semiconductor layer away from the substrate, and including first scanning signal lines, third scanning signal lines and a first electrode plate of the storage capacitor; and
a second gate conductive layer, located on a side of the first gate conductive layer away from the substrate, and including a second electrode plate of the storage capacitor.

11. The array substrate according to claim 10, wherein the pixel circuit further includes a second transistor;

the array substrate further comprises:
a second semiconductor layer, located on a side of the second gate conductive layer away from the substrate, and including a second semiconductor pattern of the second transistor;
a third gate conductive layer, located on a side of the second semiconductor layer away from the substrate, and including second scanning signal lines and reference voltage signal lines;
a first source-drain conductive layer, located on a side of the third gate conductive layer away from the substrate, and including first connection patterns, second connection patterns and third connection patterns, wherein a first connection pattern is connected to a reference voltage signal line and a first electrode of the first semiconductor pattern; a second connection pattern is connected to a second electrode of the first semiconductor pattern, a first electrode of the second semiconductor pattern, and a first electrode of the seventh semiconductor pattern; and a third connection pattern is connected to a second electrode of the second semiconductor pattern and the first electrode plate of the storage capacitor; and
a second source-drain conductive layer, located on a side of the first source-drain conductive layer away from the substrate, and including data lines, wherein a data line is connected to a first electrode of the third semiconductor pattern; and a second electrode of the third semiconductor pattern is connected to a second electrode of the seventh semiconductor pattern.

12. The array substrate according to claim 11, wherein on the substrate, an orthographic projection of the second semiconductor pattern partially overlaps with an orthographic projection of a third scanning signal line.

13. The array substrate according to claim 12, wherein the second semiconductor pattern includes:
a first portion, wherein on the substrate, an orthographic projection of the first portion is located on a side of an orthographic projection of the second scanning signal line proximate to an orthographic projection of the storage capacitor and overlaps with an orthographic projection of the third scanning signal line; and
a second portion, connected to the first portion and extends along a direction perpendicular to an extension direction of the third scanning signal line, wherein on the substrate, an orthographic projection of the second portion intersects the orthographic projection of the second scanning signal line, wherein
along the direction perpendicular to the extension direction of the third scanning signal line, a dimension of the first portion is greater than a dimension of the third scanning signal line, and on the substrate, two ends of the orthographic projection of the first portion are located on two sides of the orthographic projection of the third scanning signal line, respectively.

14. The array substrate according to claim 13, wherein on the substrate, the orthographic projection of the second portion overlaps with an orthographic projection of the second connection pattern.

15. The array substrate according to claim 11, wherein the second semiconductor pattern extends along a direction perpendicular to an extension direction of a third scanning signal line, and on the substrate, an orthographic projection of the second semiconductor pattern is separated from an orthographic projection of the second connection pattern; and/or
on the substrate, an orthographic projection of the third connection pattern partially overlaps with an orthographic projection of the third scanning signal line.

16. The array substrate according to claim 11, wherein on the substrate, an orthographic projection of the third connection pattern is located on a side of an orthographic projection of a third scanning signal line proximate to an orthographic projection of the storage capacitor; and the orthographic projection of the third connection pattern partially overlaps with an orthographic projection of the second semiconductor pattern, and an overlapping portion is located on a side of the orthographic projection of the third scanning signal line proximate to the orthographic projection of the storage capacitor.

17. The array substrate according to claim 16, wherein
a portion of the third scanning signal line is bent toward a side away from the storage capacitor to form a concave portion, and the overlapping portion of orthographic projections of the third connection pattern and the second semiconductor pattern on the substrate is located in a region defining by the concave portion.

18. The array substrate according to claim 10, wherein the third semiconductor pattern is of an L-shaped structure, and the third semiconductor pattern includes:
a first extension section extending along a first direction, the first direction being a row direction in which the plurality of pixel circuits are arranged; and
a second extension section extending along a second direction and connected to the first extension section, the second direction intersecting the first direction;
a third scanning signal line includes:
a main body extending along the first direction, an orthographic projection of the main body on the substrate partially overlapping with an orthographic projection of the second extension section on the substrate; and
protruding portions each extending along the second direction, an orthographic projection of the protruding portion on the substrate partially overlapping with an orthographic projection of the first extension section on the substrate;

and/or the second gate conductive layer further includes:
- an auxiliary second scanning signal line configured to transmit the second scanning signal, an orthographic projection of the auxiliary second scanning signal line on the substrate overlapping with an orthographic projection of a first scanning signal line on the substrate.

19. A display apparatus, comprising:
the array substrate according to claim 11; and
light-emitting devices disposed on the array substrate, wherein the light-emitting devices are electrically connected to the pixel circuits of the array substrate, and configured to emit light under control of the pixel circuits.

* * * * *

UNITED STATES PATENT AND TRADEMARK OFFICE
CERTIFICATE OF CORRECTION

PATENT NO. : 12,431,085 B2  
APPLICATION NO. : 18/558257  
DATED : September 30, 2025  
INVENTOR(S) : Zhu Wang et al.

Page 1 of 1

It is certified that error appears in the above-identified patent and that said Letters Patent is hereby corrected as shown below:

On the Title Page

Item (73) Assignees: correct BOE TECHNOLOGY GROUP CO., LTD, to BOE TECHNOLOGY GROUP CO., LTD., Signed and Sealed this  
Twenty-fifth Day of November, 2025

John A. Squires  
*Director of the United States Patent and Trademark Office*